United States Patent
Wei

(10) Patent No.: US 11,700,724 B2
(45) Date of Patent: Jul. 11, 2023

(54) SEMICONDUCTOR MEMORY STRUCTURE AND METHOD FOR MANUFACTURING THE SAME

(71) Applicant: Winbond Electronics Corp., Taichung (TW)

(72) Inventor: Hung-Yu Wei, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/320,633

(22) Filed: May 14, 2021

(65) Prior Publication Data

US 2022/0367475 A1    Nov. 17, 2022

(51) Int. Cl.
*H01B 12/00*    (2006.01)
*H10B 12/00*    (2023.01)
*H01L 29/06*    (2006.01)

(52) U.S. Cl.
CPC ......... *H10B 12/30* (2023.02); *H01L 29/0653* (2013.01); *H10B 12/02* (2023.02)

(58) Field of Classification Search
None
See application file for complete search history.

(56) References Cited

U.S. PATENT DOCUMENTS

| | | |
|---|---|---|
| 8,120,099 B2 | 2/2012 | Seo et al. |
| 8,486,819 B2 | 7/2013 | Kim |
| 9,224,619 B2 | 12/2015 | Yi et al. |
| 9,368,589 B2 | 6/2016 | Baek et al. |
| 10,134,740 B2 | 11/2018 | Kim et al. |
| 10,319,726 B2 | 6/2019 | Nam et al. |
| 2010/0019358 A1* | 1/2010 | Cheng ............... H01L 29/66795 257/E29.132 |
| 2018/0286742 A1* | 10/2018 | Nagai ............ H01L 21/823481 |
| 2018/0301456 A1* | 10/2018 | Cho ........................ H01L 21/84 |

FOREIGN PATENT DOCUMENTS

| | | |
|---|---|---|
| TW | 201901930 A | 1/2019 |
| TW | 202036847 A | 10/2020 |

\* cited by examiner

*Primary Examiner* — Mohammad M Hoque
*Assistant Examiner* — Kevin Quinto
(74) *Attorney, Agent, or Firm* — Muncy, Geissler, Olds & Lowe, P.C.

(57) ABSTRACT

A semiconductor structure includes a semiconductor substrate including a first active region and a chop region. The semiconductor structure also includes a source/drain region disposed in the first active region, an isolation structure disposed in the chop region, and a gate structure extending at least across the isolation structure in the chop region. The gate structure includes a gate electrode layer and a gate lining layer lining on the gate electrode layer. The gate lining layer includes a first portion having an upper surface that is lower than a bottom surface of the source/drain region.

20 Claims, 18 Drawing Sheets

SEMICONDUCTOR MEMORY STRUCTURE AND METHOD FOR MANUFACTURING THE SAME

BACKGROUND

Technical Field

The present disclosure is related to a memory device, and in particular it is related to a dynamic random access memory (DRAM).

Description of the Related Art

In order to increase the component density and improve the overall performance of a DRAM device, the current technology for manufacturing DRAM devices is continuously being improved, including efforts to scale down the physical size of components. However, many challenges arise when the component dimensions are scaled down, for example, to improve the source/drain junction leakage. Therefore, the industry still needs to improve the manufacturing methods for DRAM devices if it is to overcome the problems caused by scaling down device sizes.

BRIEF SUMMARY

In accordance with some embodiments of the present disclosure, a semiconductor memory structure is provided. The semiconductor memory structure includes a semiconductor substrate including a first active region and a chop region; a source/drain region disposed in the first active region; an isolation structure disposed in the chop region; and a first gate structure extending at least across the isolation structure in the chop region. The first gate structure includes a first gate electrode layer and a first gate lining layer lining the first gate electrode layer. The first gate lining layer includes a first portion in the chop region. An upper surface of the first portion of the first gate lining layer is lower than a bottom surface of the source/drain region.

In accordance with some embodiments of the present disclosure, a semiconductor memory structure is provided. The semiconductor memory structure includes a semiconductor substrate; a gate structure embedded in the semiconductor substrate, wherein the gate structure includes a gate lining layer, the gate lining layer includes a first portion and a second portion protruding above the first portion; and a source/drain region disposed in the semiconductor substrate. A bottom surface of the source/drain region is higher than an upper surface of the first portion of the gate lining layer and is lower than an upper surface of the second portion of the gate lining layer.

In accordance with some embodiments of the present disclosure, a method for forming a semiconductor memory structure is provided. The method includes the following steps. A semiconductor substrate that includes a chop region and an active region is provided. A first and second gate structure are formed, wherein the first gate structure extends across the chop region and the second gate structure extends across the active region. The first and second gate structures each include a gate electrode layer and a gate lining layer that lines the gate electrode layer. A patterned mask layer is formed in such a way that it covers the second gate structure and exposes the first gate structure. The gate lining layer of the first gate structure is etched using the patterned mask layer. A source/drain region is formed in the active region. After the gate lining layer of the first gate structure has been etched, an upper surface of the gate lining layer of the first gate structure is lower than a bottom surface of the source/drain region.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

FIGS. 1A-1, 1B-1, 1C-1, 1D-1, 1E-1, 1F-1, 1G-1, and 1H-1 illustrate a cross-sectional view of forming a semiconductor memory structure at different stages according to some embodiments of the present disclosure.

FIGS. 1A-2, 1B-2, 1C-2, 1D-2, 1E-2, 1F-2, 1G-2, and 1H-2 illustrate a cross-sectional view of forming a semiconductor memory structure at different stages according to some embodiments of the present disclosure.

FIGS. 1D-3, 1E-3, 1F-3, 1G-3, and 1H-3 illustrate a cross-sectional view of forming a semiconductor memory structure at different stages according to some embodiments of the present disclosure.

FIG. 2 illustrates a cross-sectional view of a semiconductor memory structure according to some embodiments of the present disclosure.

FIGS. 3A-1, 3B-1, and 3C-1 illustrate a cross-sectional view of forming a semiconductor memory structure at different stages according to some embodiments of the present disclosure.

FIGS. 3A-2, 3B-2, and 3C-2 illustrate a cross-sectional view of forming a semiconductor memory structure at different stages according to some embodiments of the present disclosure.

DETAILED DESCRIPTION

For the sake of clarity, FIGS. 1A to 1H indicate reference directions, wherein the first direction D1 is the channel extending direction, the second direction D2 is the word line extending direction (or gate extending direction), and the third direction D3 is the bit line extending direction. The second direction D2 is approximately perpendicular to the third direction D3.

FIGS. 1A to 1H also indicate reference cross-sections. Cross-section A-A is along a plane parallel to the axis of the gate structure (i.e., the second direction D2) and passing through the gate electrode layer. Cross-section B-B is along a plane parallel to the axis of the active region (i.e., the first direction D1) and passing through the active region. Cross-section C-C is along a plane parallel to the axis of the gate structure and passing through the gate lining layer.

FIGS. 1A-1, 1B-1, 1C-1, 1D-1, 1E-1, 1F-1, 1G-1, and 1H-1 illustrate a cross-sectional view of a semiconductor memory structure taken along cross section A-A of FIGS. 1A to 1H. FIGS. 1A-2, 1B-2, 1C-2, 1D-2, 1E-2, 1F-2, 1G-2, and 1H-2 illustrate a cross-sectional view of a semiconductor memory structure taken along cross section B-B of FIGS. 1A to 1H. FIGS. 1D-3, 1E-3, 1F-3, 1G-3, and 1H-3 illustrate a cross-sectional view of a semiconductor memory structure taken along cross section C-C of FIGS. 1D to 1H.

Figure 1A:
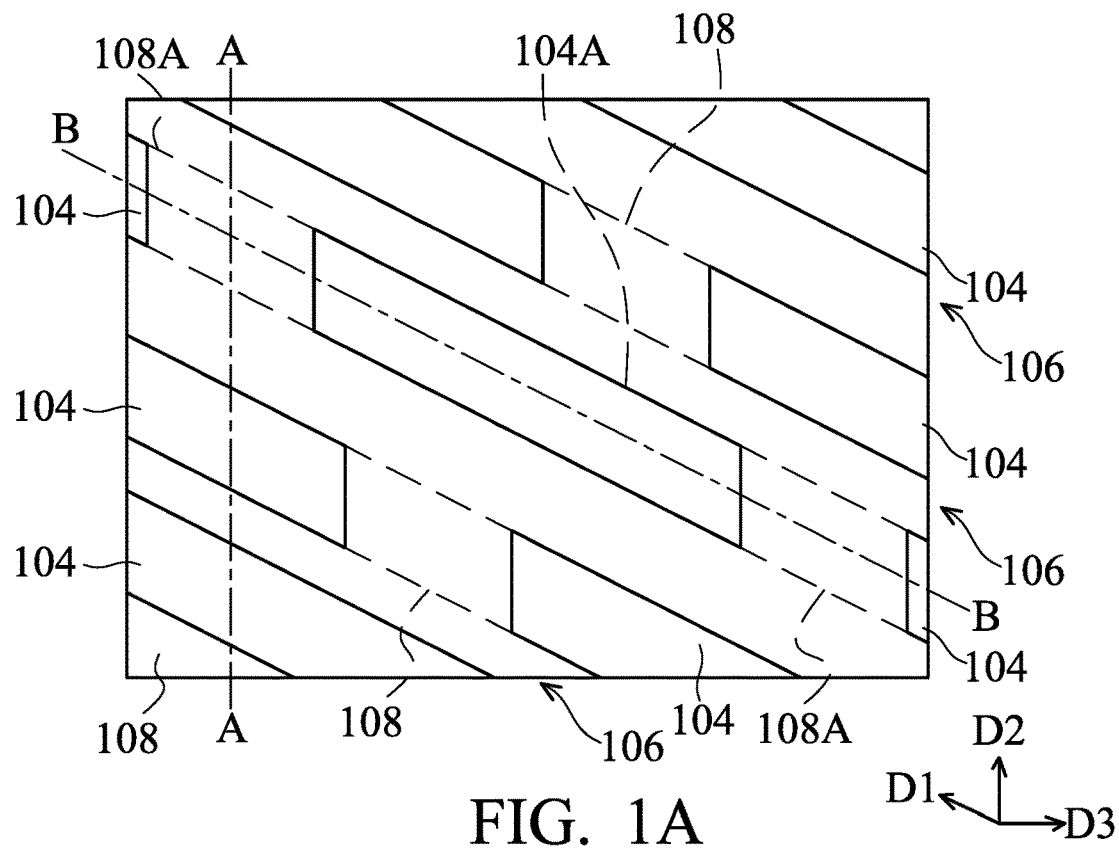
FIGS. 1A, 1B, 1C, 1D, 1E, 1F, 1G, and 1H illustrate a plan view of forming a semiconductor memory structure at different stages according to some embodiments of the present disclosure.
Figures 1, 1A:
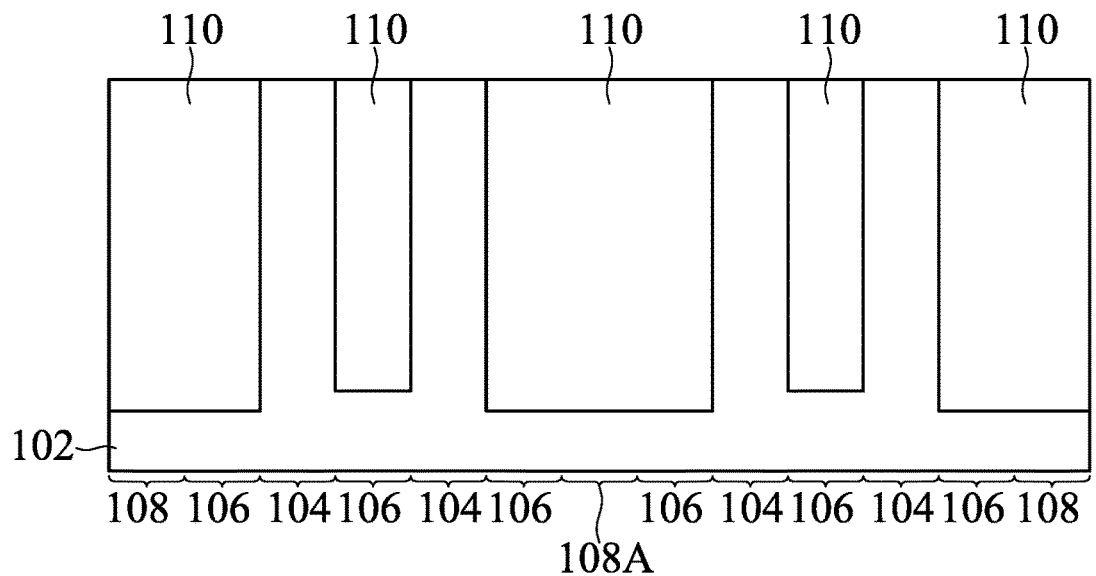
Figures 1, 1A, 2:
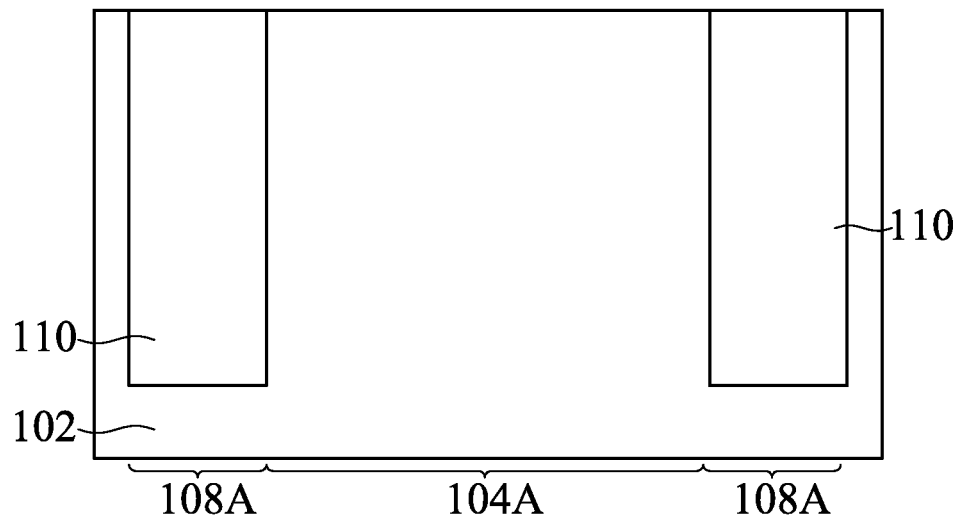

A semiconductor substrate 102 is provided to form semiconductor memory structures thereon. The semiconductor substrate 102 includes an active region 104, isolation regions 106, and a chop region 108, as shown in FIGS. 1A, 1A-1, and 1A-2. The active region 104 is a semiconductor block extending in the first direction D1, and each active region 104 is defined by two isolation regions 106 and a chop region 108. An isolation structure 110 is formed in the isolation regions 106 and the chop region 108 of the semiconductor substrate 102, thereby enclosing and electrically isolating the active region 104.

The isolation regions 106 extend along the first direction D1 and are spaced apart from each other in the second direction D2, thereby dividing the semiconductor substrate 102 into a plurality of semiconductor strips (not shown). The chop region 108 (which is indicated by a dashed line) is disposed corresponding to the semiconductor strips, and chops the semiconductor strips into a plurality of active regions 104. In the second direction D2, the adjacent chop regions 108 may be misaligned or non-overlapping.

The isolation structure 110 extends down from the upper surface of the semiconductor substrate 102. In some embodiments, the isolation structure 110 is formed of dielectric materials, such as silicon oxide (SiO), silicon nitride (SiN), silicon oxynitride (SiON), and/or a combination thereof.

Figure 1B:
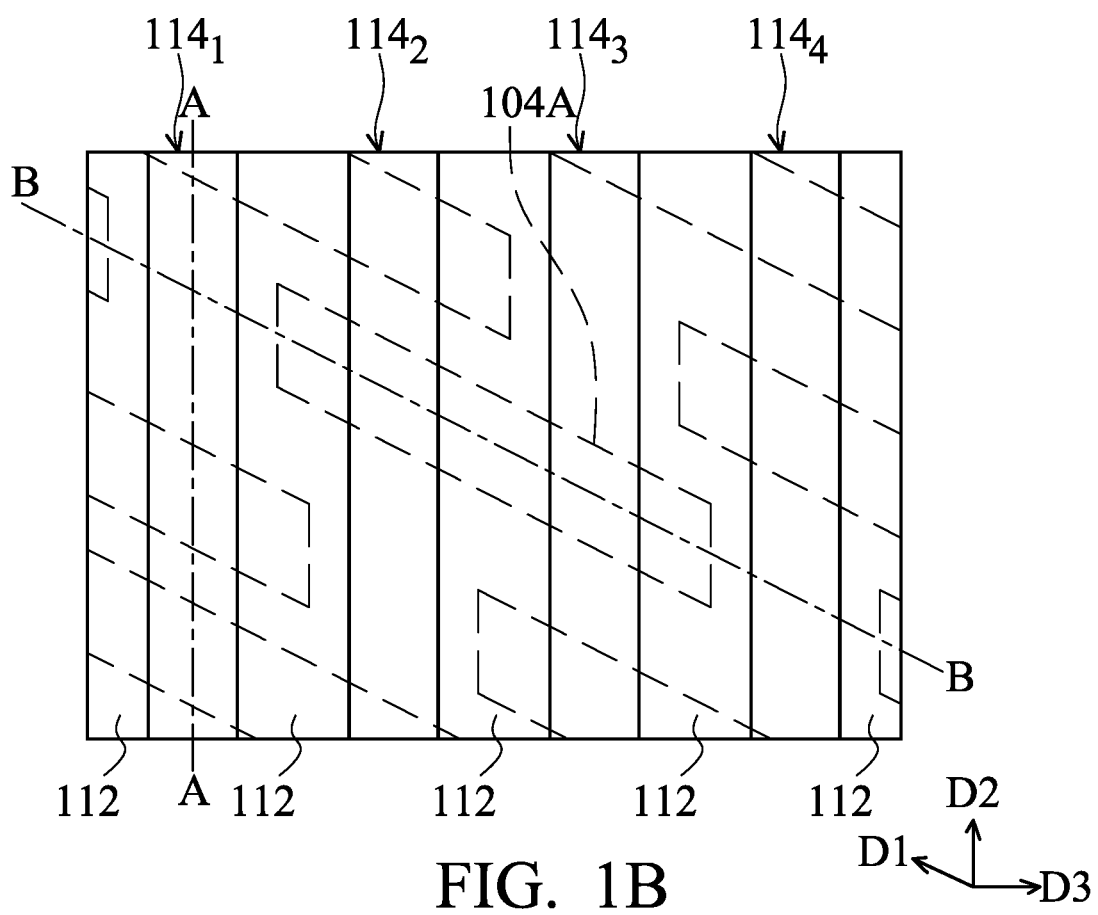
Figures 1, 1B:
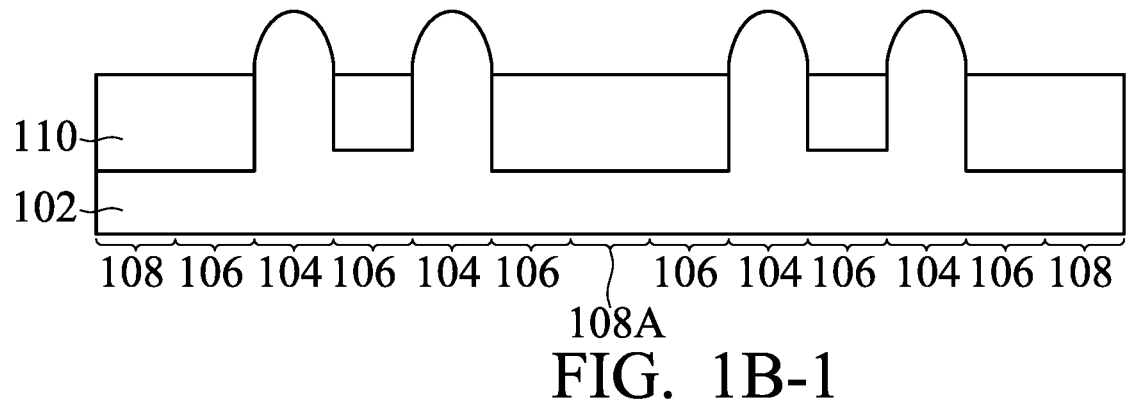
Figures 1, 1B, 2:
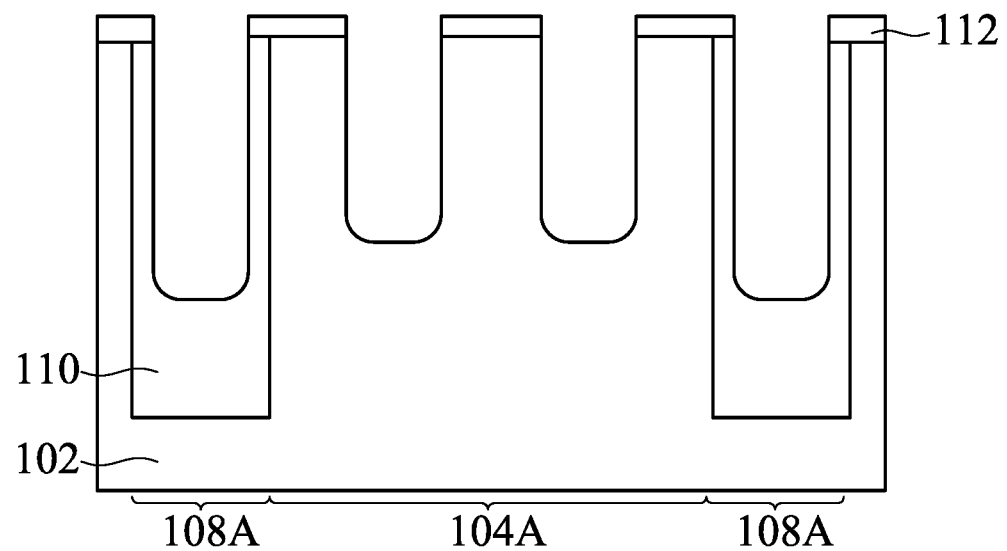

For the sake of clarity, the active region in the center of FIG. 1A is indicated as 104A, and the chop region on the opposite sides of the active region 104A is indicated as 108A. The semiconductor memory structure is patterned to form the trenches 114 (including $114_1$, $114_2$, $114_3$, and $114_4$) in the semiconductor substrate 102, as shown in FIGS. 1B, 1B-1, and 1B-2. The trenches $114_1$, $114_2$, $114_3$, and $114_4$ extend along the second direction D2 and are arranged in the third direction D3. The trenches 114 extend across the active region 104 and the isolation structure 110 alternately. The trenches $114_2$ and $114_3$ extend across the active region 104A, and the trenches $114_1$ and $114_4$ extend across the chop region 108A on the opposite sides of the active region 104A, as shown in FIGS. 1B and 1B-2.

The patterning process for forming the trenches 114 includes forming a patterned mask layer 112 on the upper surface of the semiconductor substrate 102. The patterned mask layer 112 has openings corresponding to the trenches 114. In some embodiments, the patterned mask layer 112 may be a hard mask layer formed of dielectric materials, such as silicon oxide (SiO), silicon nitride (SiN), silicon oxynitride (SiON), and/or a combination thereof. The patterning process also includes using an etching process to remove the portions of the semiconductor memory structure that are not covered by the patterned mask layer 112, so as to form the trenches 114. The etching depth of the trenches 114 may be different in the active region 104 and the isolated structure 110.

Figure 1C:
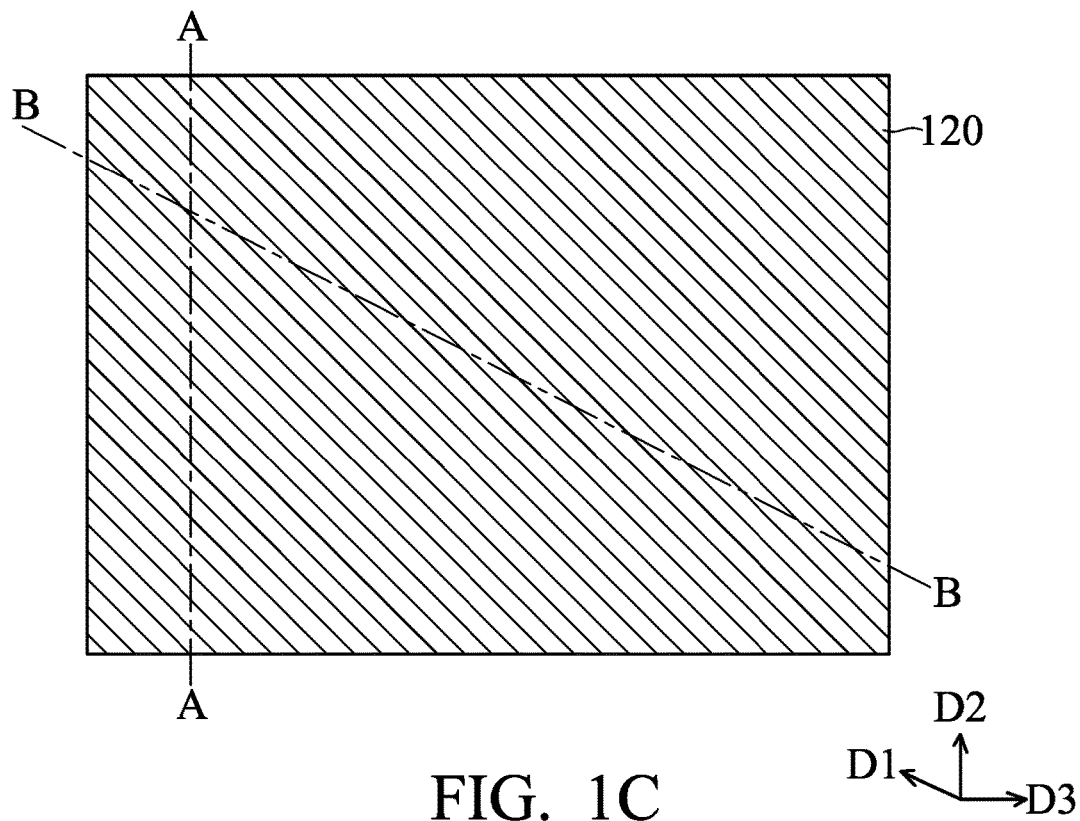
Figures 1, 1C:
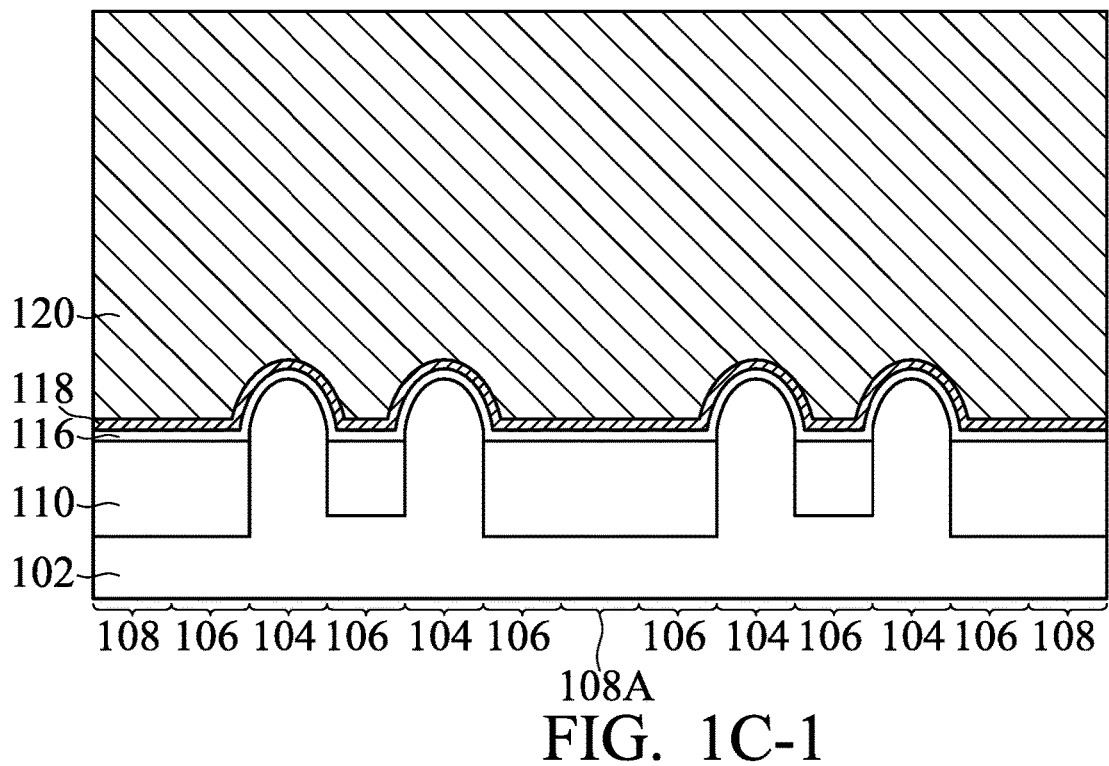
Figures 1, 1C, 2:
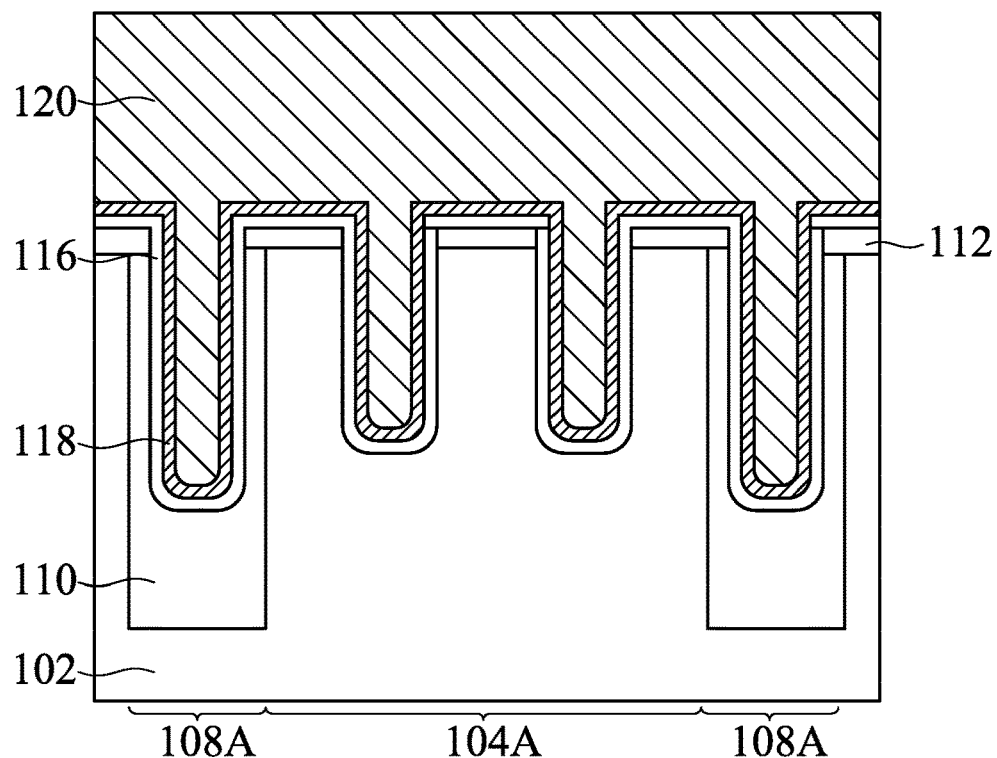

Sequentially, the gate dielectric layer 116, the gate lining layer 118, and the gate electrode layer 120 are formed on the semiconductor memory structure, as shown in FIGS. 1C, 1C-1, and 1C-2. The gate dielectric layer 116 is formed along the upper surface of the patterned mask layer 112, the sidewalls of the patterned mask layer 112, the bottom surface of the trenches 114 and the sidewalls of the trenches 114 to partially fill the trenches 114. In some embodiments, the gate dielectric layer 116 is formed of silicon oxide, silicon nitride, silicon oxynitride, and/or high k dielectric materials. The gate lining layer 118 is formed on the gate dielectric layer 116 to partially fill the trenches 114. In some embodiments, the gate lining layer 118 is formed of titanium nitride (TiN), tungsten nitride (WN), and/or tantalum nitride (TaN). The gate electrode layer 120 is formed on the gate lining layer 118 to overfill the remaining portions of the trenches 114. In some embodiments, the gate electrode layer 120 is formed of metallic materials, such as tungsten (W), aluminum (Al), copper (Cu), cobalt (Co), ruthenium (Ru).

An etching process is performed on the gate electrode layer 120 and the gate lining layer 118 to form a recess 124 extending to the semiconductor substrate 102, as shown in FIGS. 1D, 1D-1, 1D-2, 1D-3. The etching process may also remove the gate dielectric layer 116 formed over the patterned mask layer 112.

After the etching process, the gate structures 122 (including $122_1$, $122_2$, $122_3$, and $122_4$) is formed, and each of the gate structures 122 includes a gate dielectric layer 116, a gate lining layer 118, and a gate electrode layer 120. The gate lining layer 118 is lined between the gate dielectric layer 116 and the gate electrode layer 120, and the gate electrode layer 120 is embedded within the gate lining layer 118. According to some embodiments, each of the gate structures 122 extends across the active region 104 and the isolation structure 110 alternately. The gate structure 122 may serve as a word line of the resulting semiconductor memory device, and is also referred to as a buried word line.

Figure 1D:
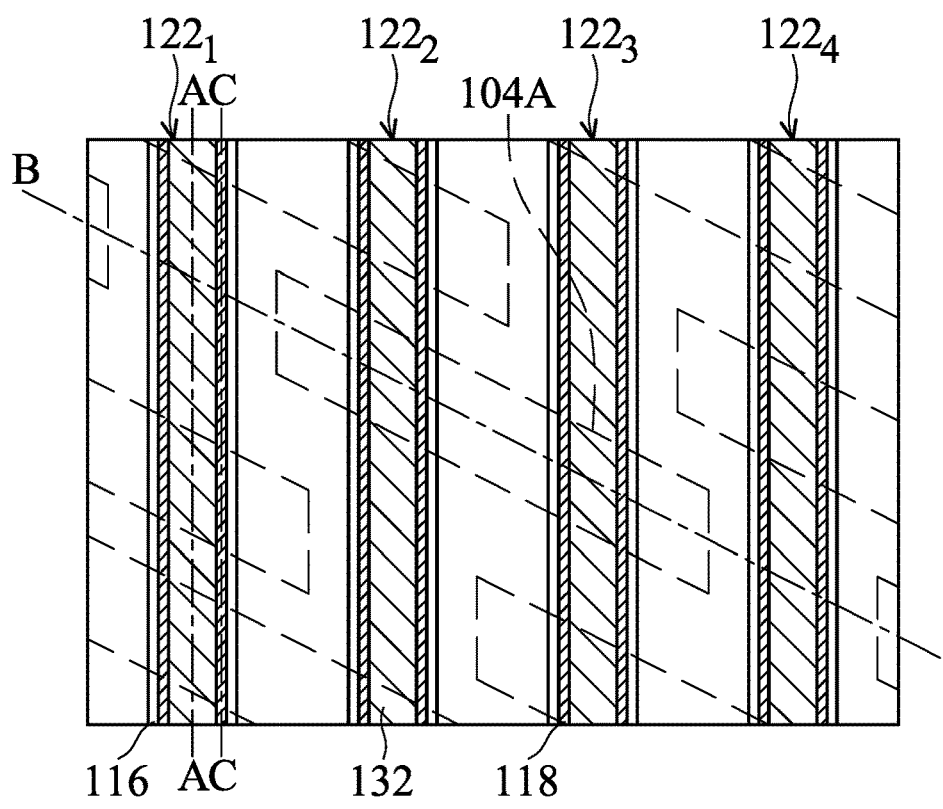
Figures 1, 1D:
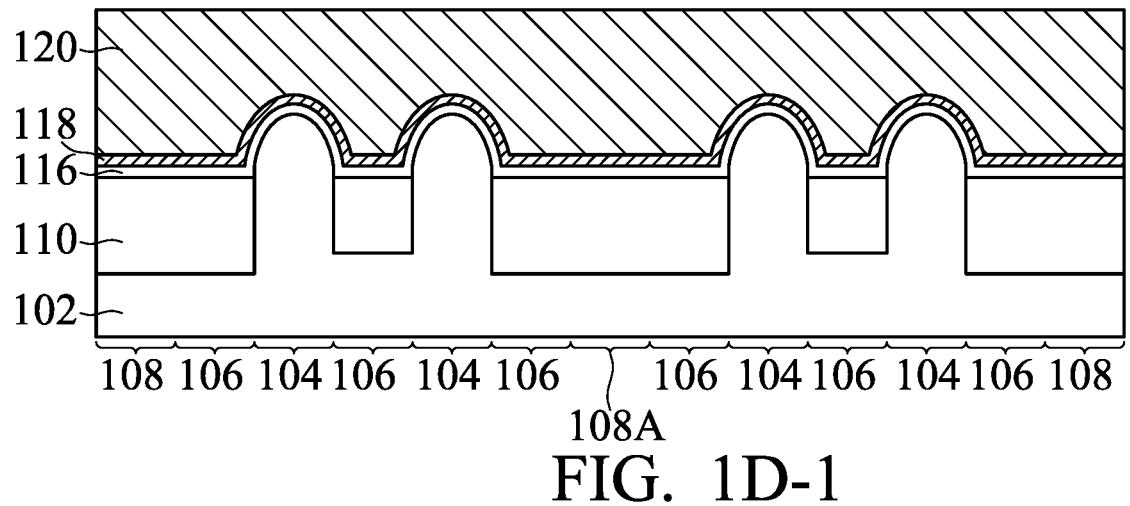
Figures 1, 1D, 2:
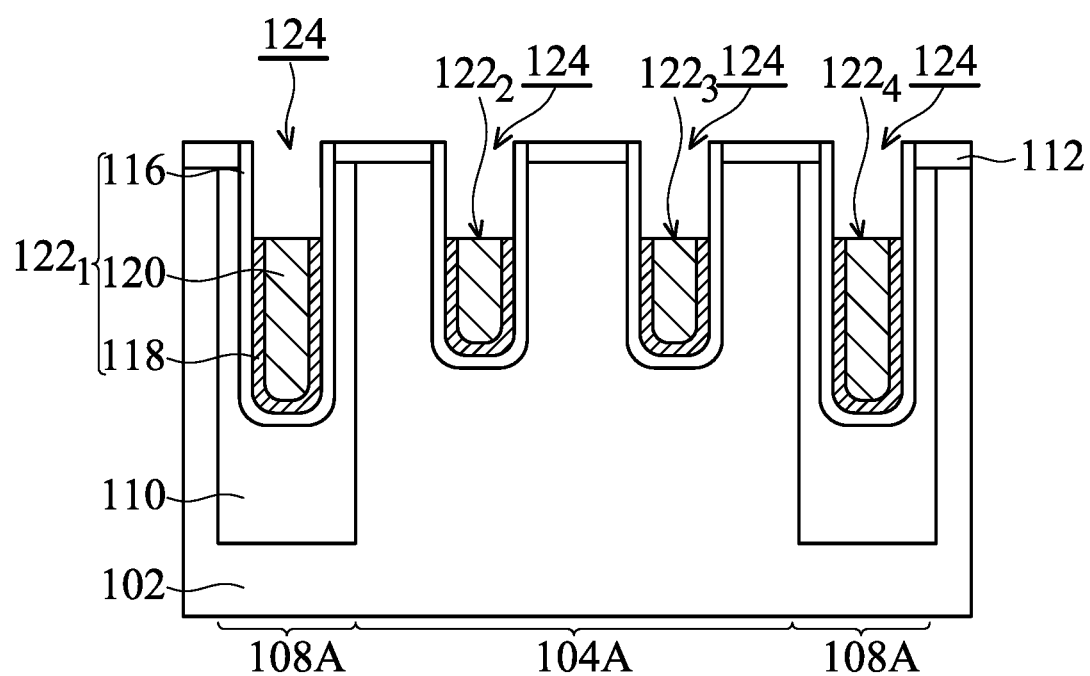
Figures 1, 1D, 2, 3:
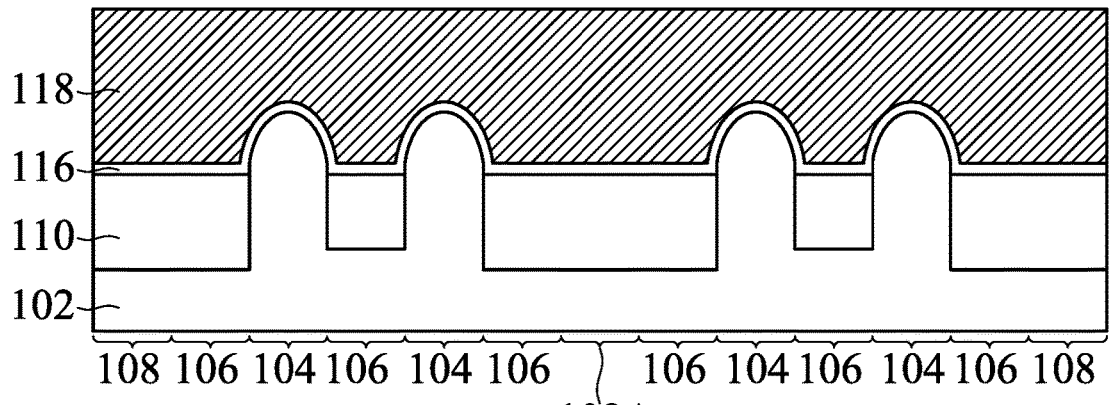
Figure 1E:
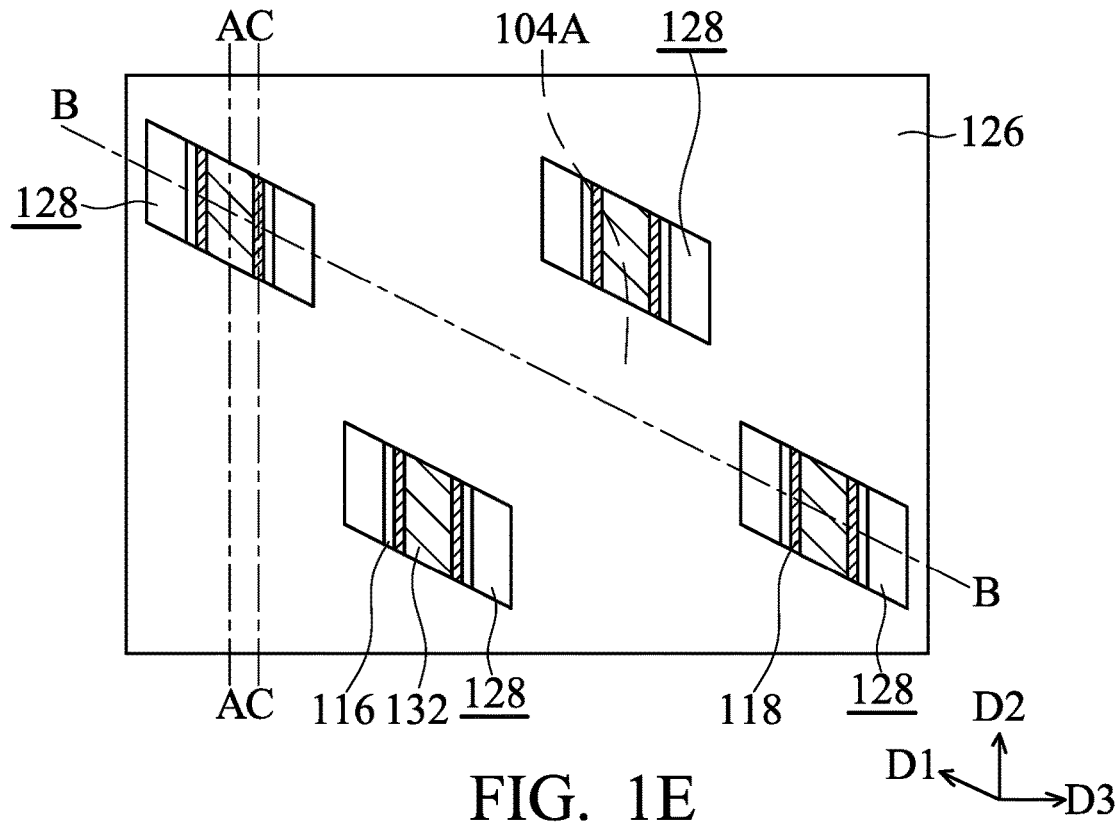
Figures 1, 1E:
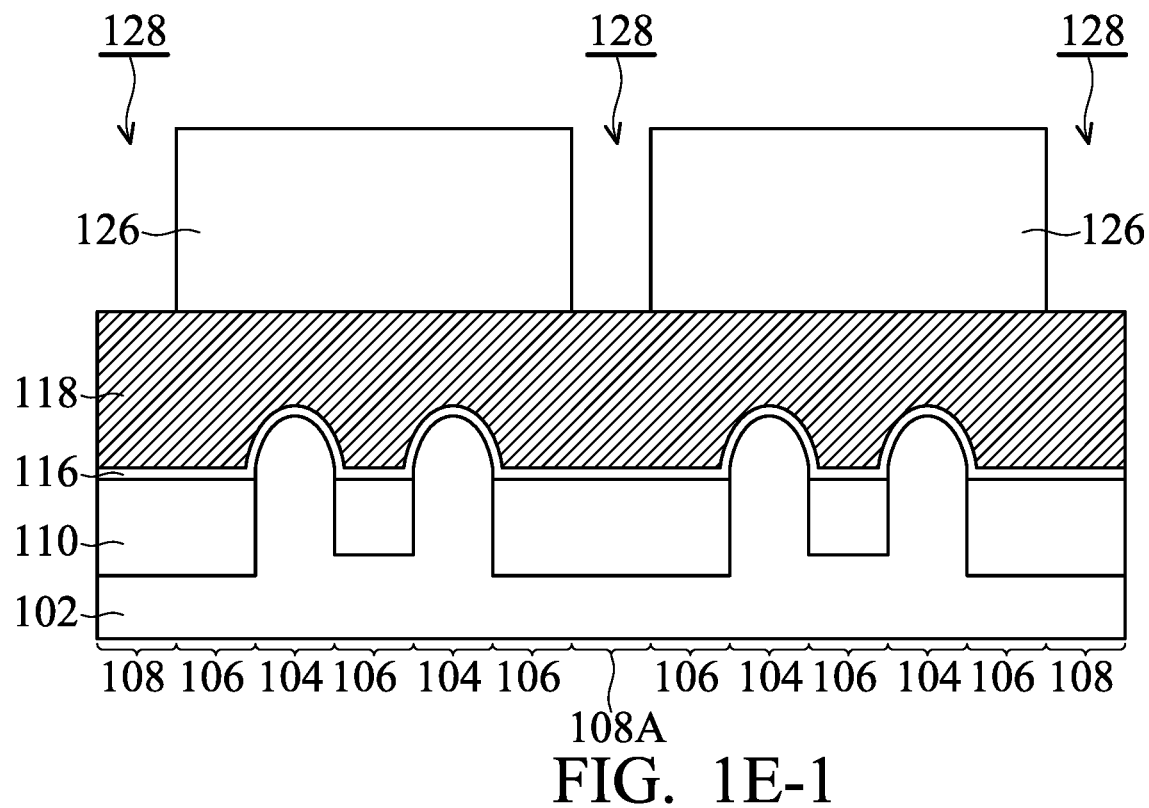
Figures 1, 1E, 2:
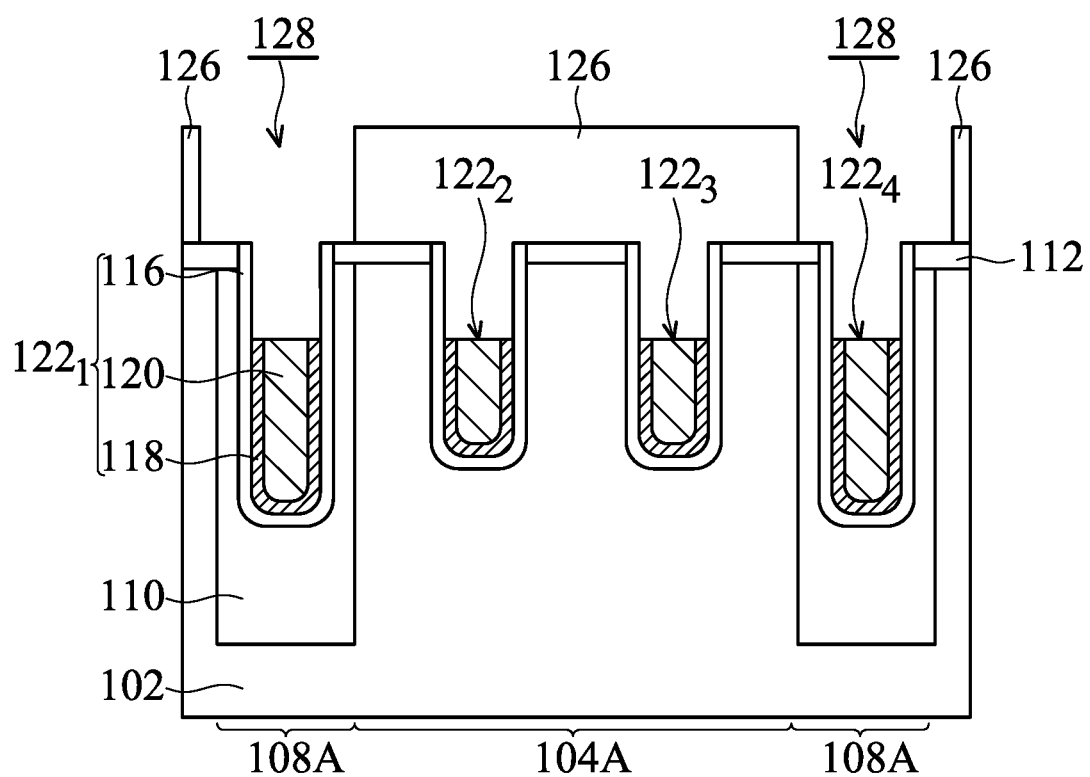
Figures 1, 1E, 2, 3:
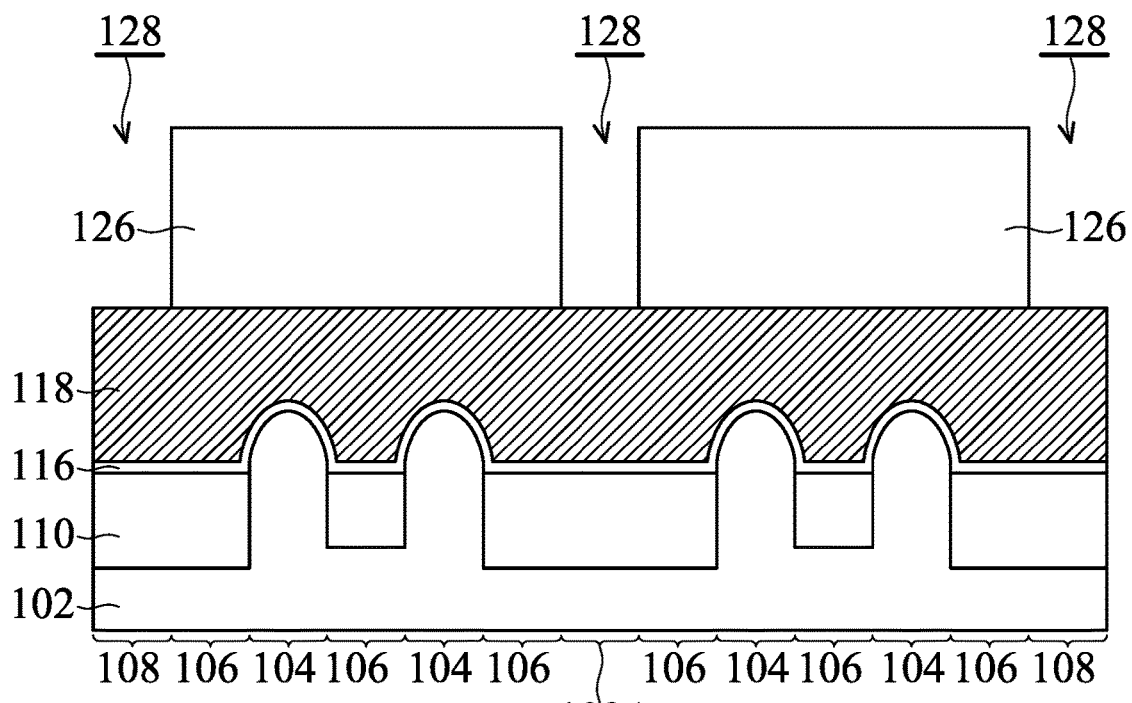

The gate structures $122_2$ and $122_3$ extend across the active region 104A. The gate structures $122_1$ and $122_4$ pass through the chop region 108A on the opposite sides of the active region 104A, respectively, as shown in FIGS. 1D and 1D-2.

A patterned mask layer 126 is formed on the semiconductor memory structure, as shown in FIGS. 1E, 1E-1, 1E-2, and 1E-3. The patterned mask layer 126 has openings 128 corresponding to the chop regions 108 of the semiconductor substrate 102. In some embodiments, the patterned mask layer 126 may be formed of photoresist materials.

The openings 128 expose the portions of the gate structures 122, which extend across the isolation structures 110 in the chop region 108. For example, the openings 128 expose the portions of gate structures $122_1$ and $122_4$, which extend across the chop region 108A. The patterned mask layer 126 covers the portions of the gate structure 122 extending across the active region 104 and across the isolation structure 110 in the isolation region 106. For example, the patterned mask layer 126 covers the portions of the gate structures $122_2$ and $122_3$ extending across the active region 104A.

By using the patterned mask layer 126, an etching process is performed on the gate structure 122 to recess the gate lining layer 118, thereby forming a gap 130 between the gate electrode layer 120 and the gate dielectric layer 116, as shown in FIGS. 1F, 1F-1, 1F-2, and 1F-3. During the etching process, etching selectivity is present between the gate lining layer 118 and the gate electrode layer 120, so that the gate electrode layer 120 may be slightly etched or substantially unetched. After the etching process, the patterned mask layer 126 is removed.

Figure 1F:
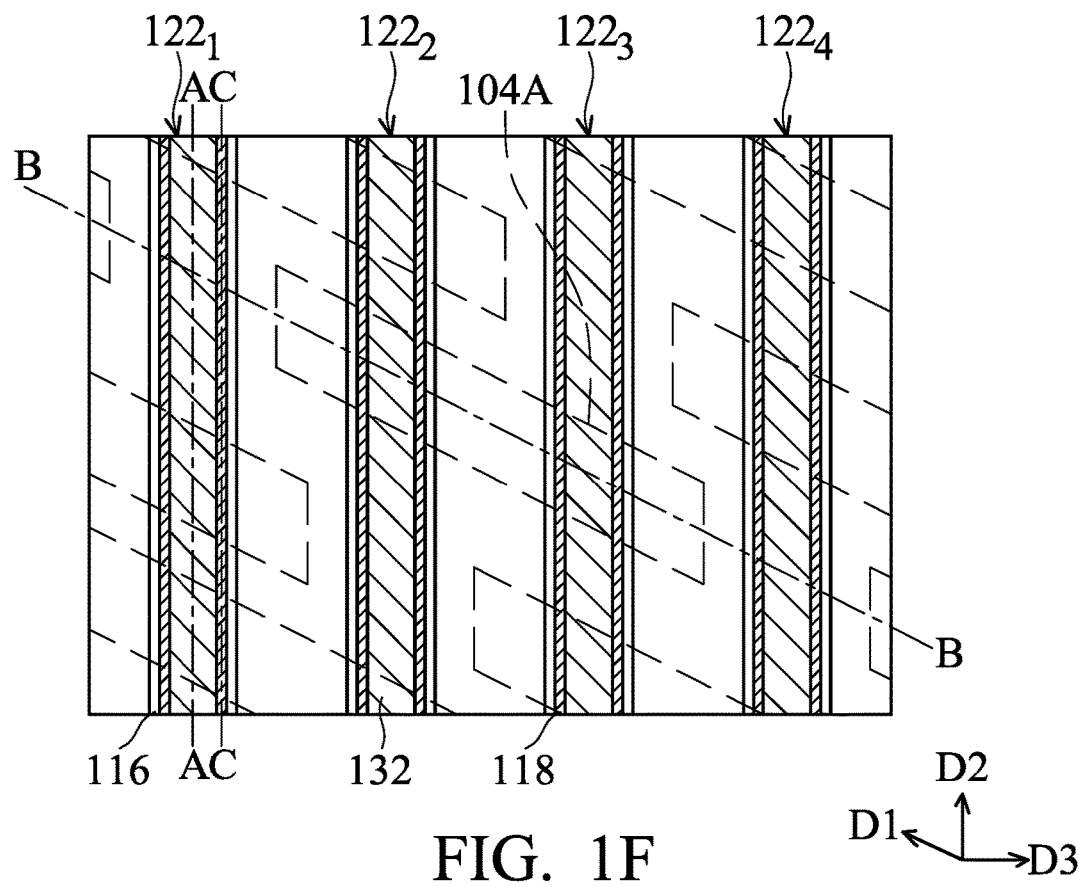
Figures 1, 1F:
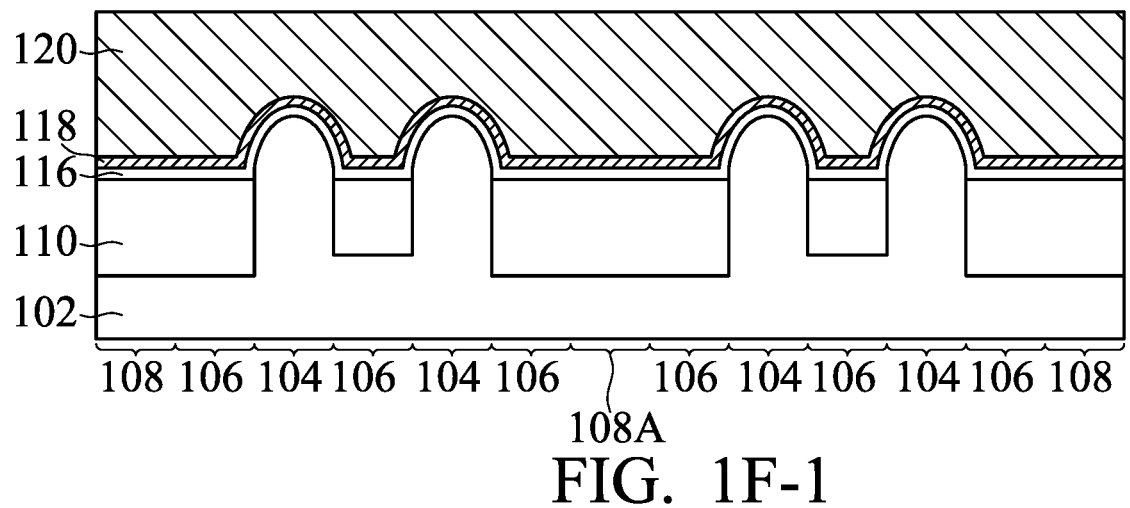
Figures 1, 1F, 2:
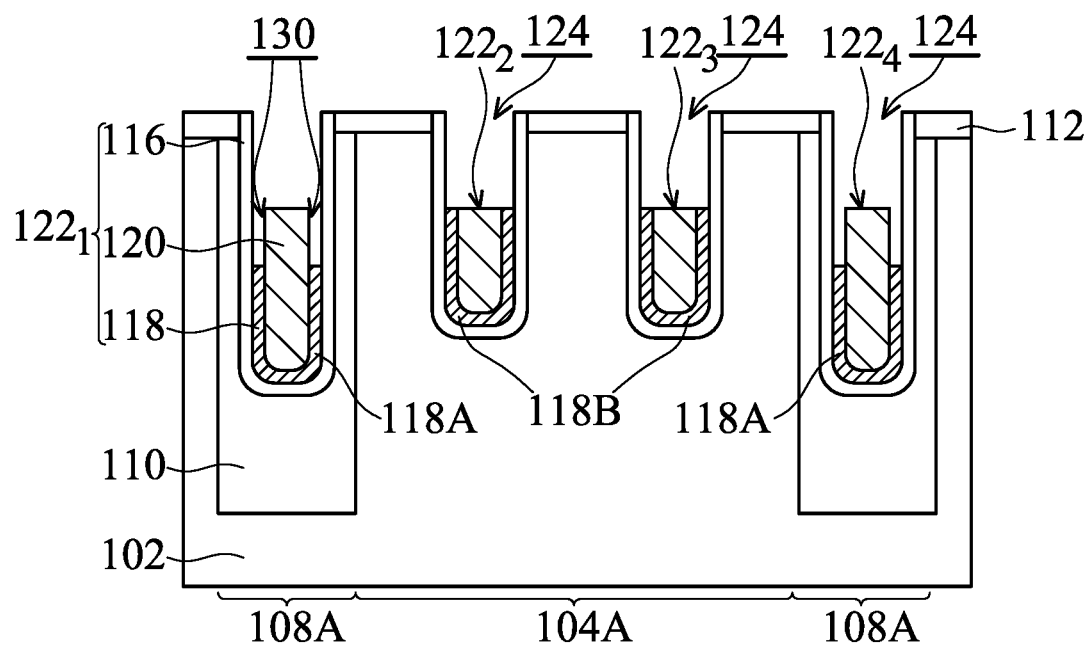
Figures 1, 1F, 2, 3:
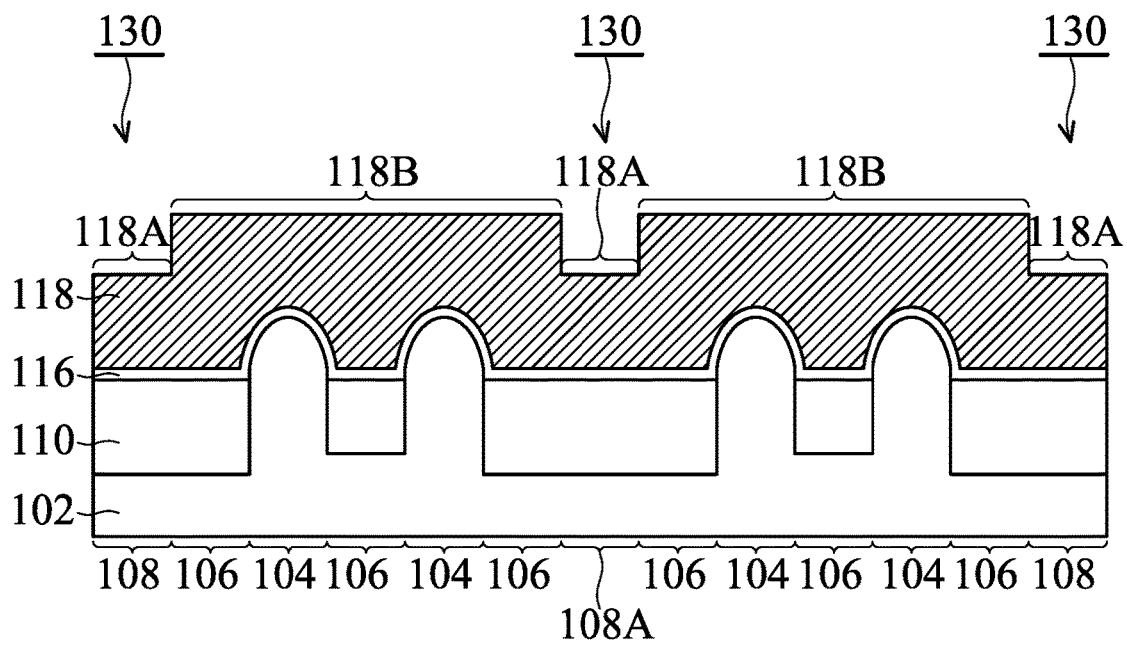
Figure 1G:
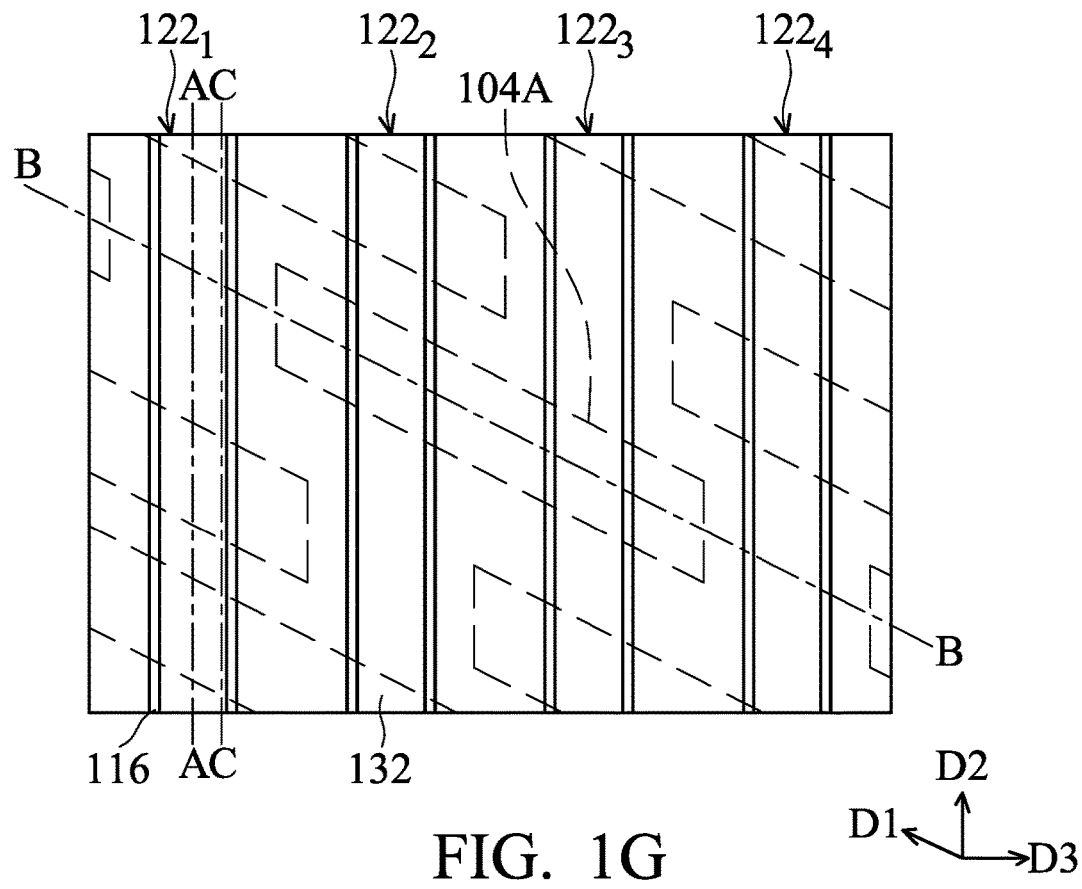
Figures 1, 1G:
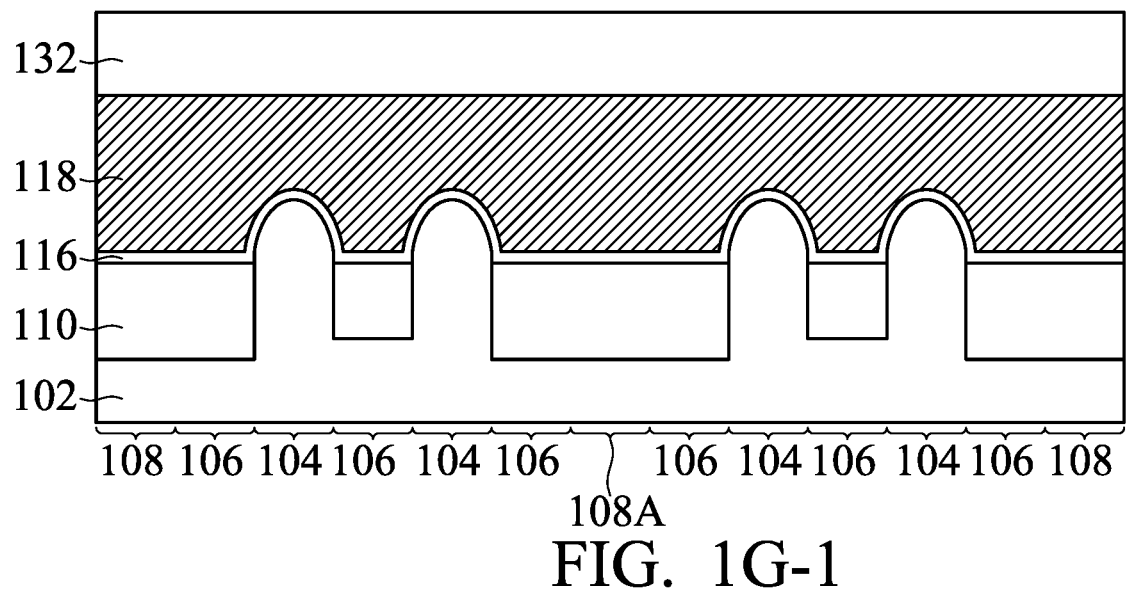
Figures 1, 1G, 2:
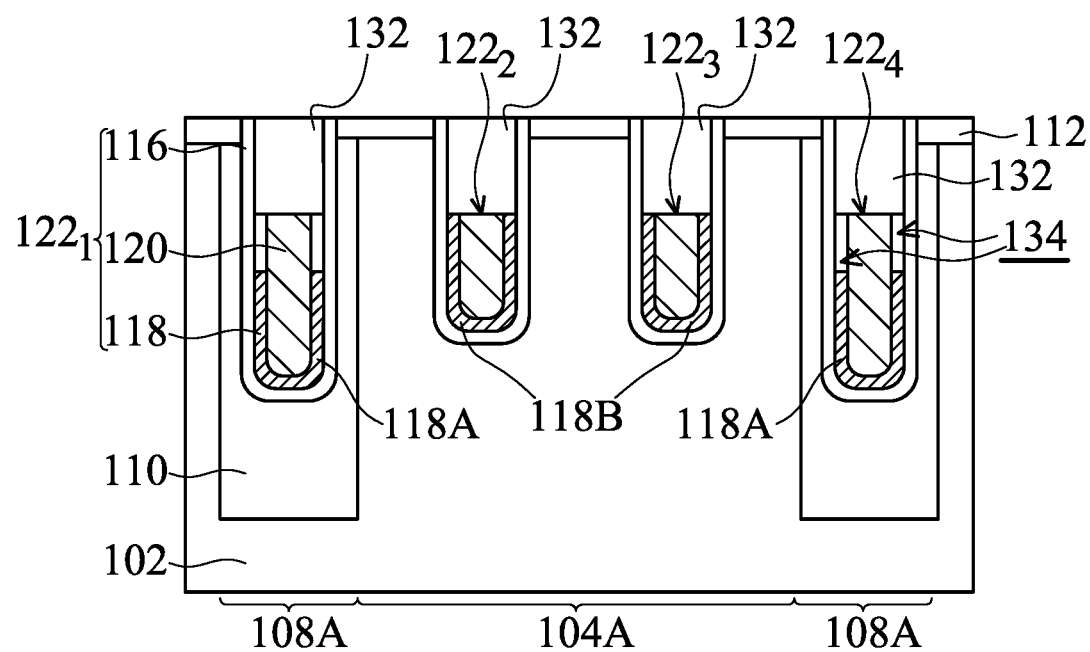
Figures 1, 1G, 2, 3:
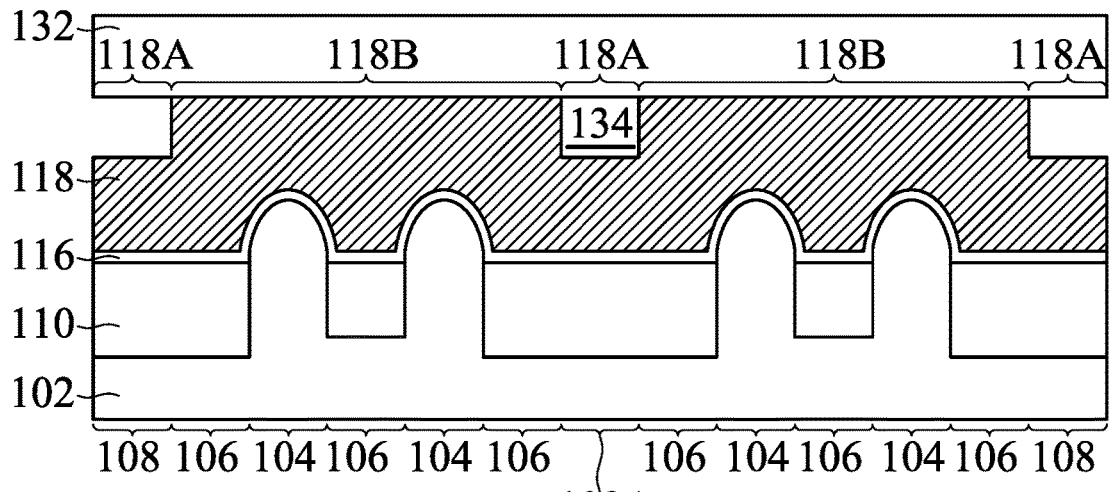

Some portions of the gate lining layer 118 extending across the isolation structure 110 in the chop region 108 are recessed to form a gap 130 in the chop region 108. The portions of the gate lining layer 118 extending across the active region 104 and the isolation structure 110 in the isolation region 106 remain unetched. For example, as shown in FIG. 1F-2, the gap 130 is formed in the chop region 108A, and the gate lining layer 118 in the active region 104A remains unetched.

After the etching process, the recessed portions of the gate lining layer 118 are referred to as depressions 118A, and the unetched portions of the gate lining layer 118 are referred to as protrusions 118B, which protrude above the depressions 118A. The depressions 118A correspond to and are located in the chop region 108, while the protrusions 118B correspond to and are located in the active region 104 and the isolation region 106, as shown in FIG. 1F-3. The depressions 118A and the protrusions 118B are alternately arranged in the second direction D2. In addition, an upper surface of the protrusions 118B is coplanar with an upper surface of the gate electrode layer 120.

A capping layer 132 is formed in the recess 124, as shown in FIGS. 1G, 1G-1, 1G-2, and 1G-3. The capping layer 132 seals the gap 130 to form an air gap 134 between the gate electrode layer 120 and the gate dielectric layer 116. The air gap 134 is located in the chop region 108, but is not formed in the active region 104. In addition, the air gap 134 is between two adjacent protrusions 118B of the gate lining layer 118 in the second direction D2. The air gap 134 exposes a side surface of the protrusions 118B.

In some embodiments, the capping layer 132 is formed of dielectric materials, such as silicon oxide, silicon nitride, silicon oxynitride, and/or a combination thereof. Forming the capping layer 132 may include depositing a dielectric material to fill the recess 124 and performing a planarization process to remove the dielectric material formed on the upper surface of the patterned mask layer 112.

Figure 1H:
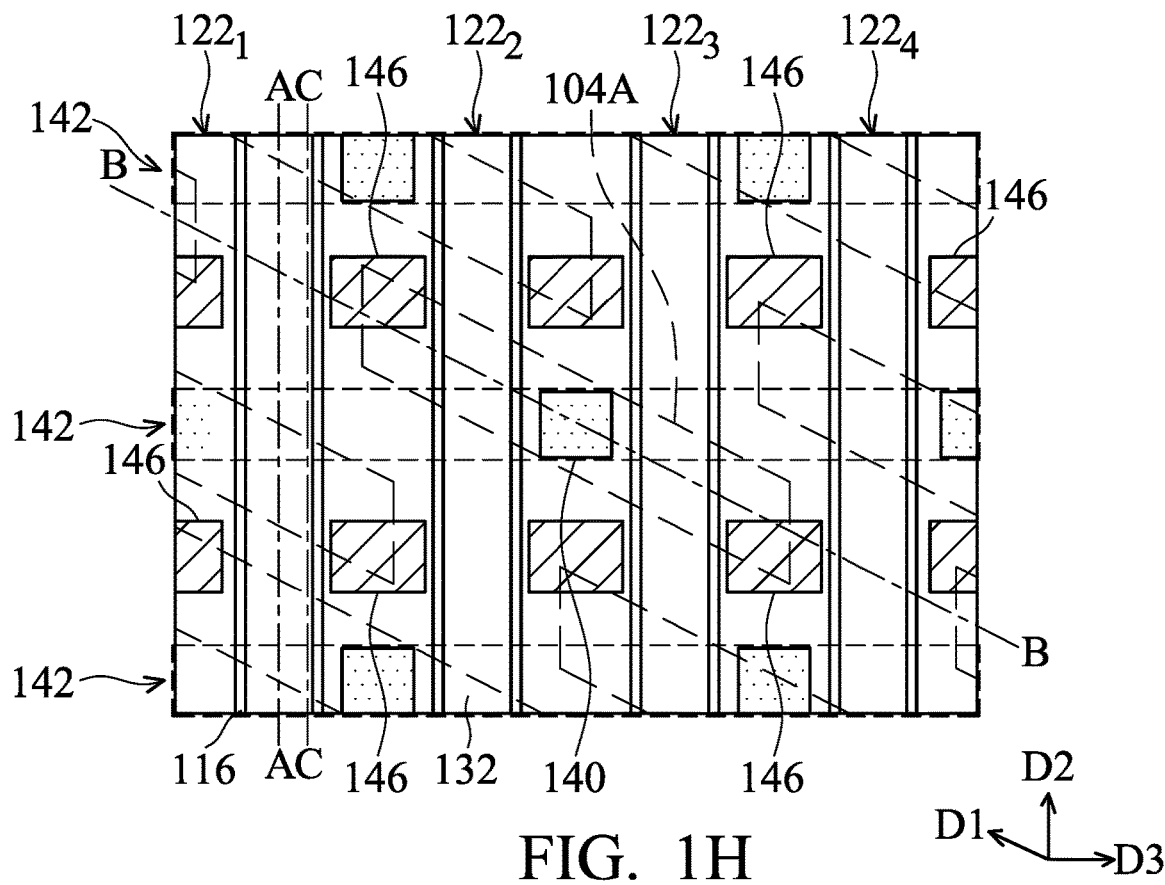
Figures 1, 1H:
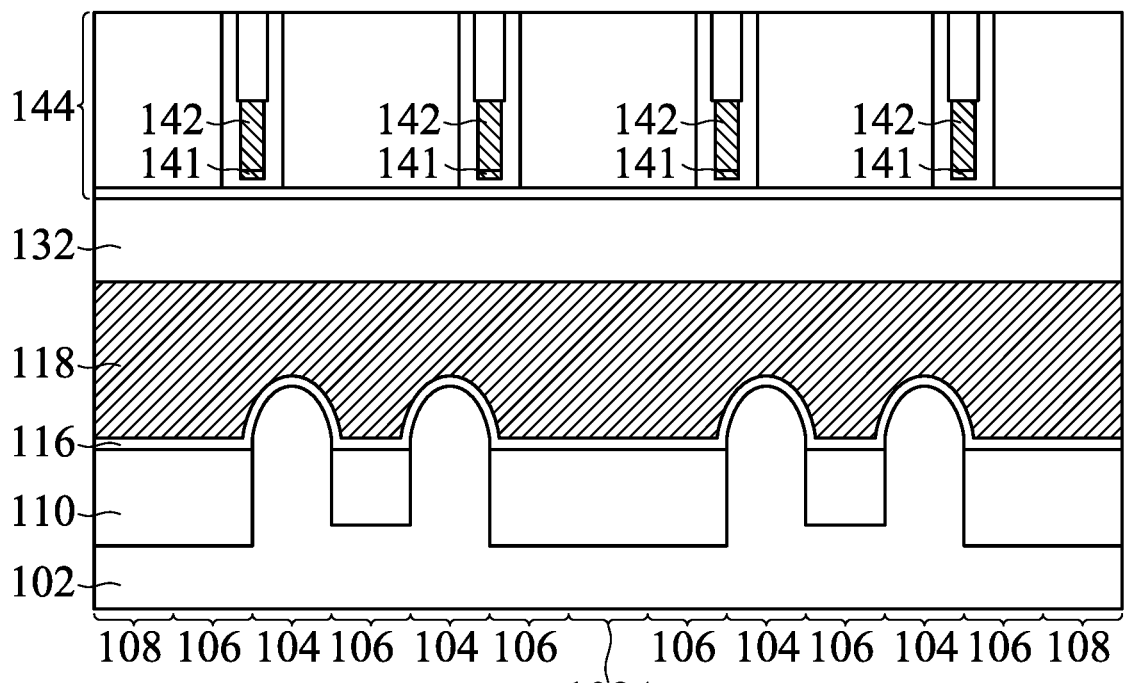
Figures 1, 1H, 2:
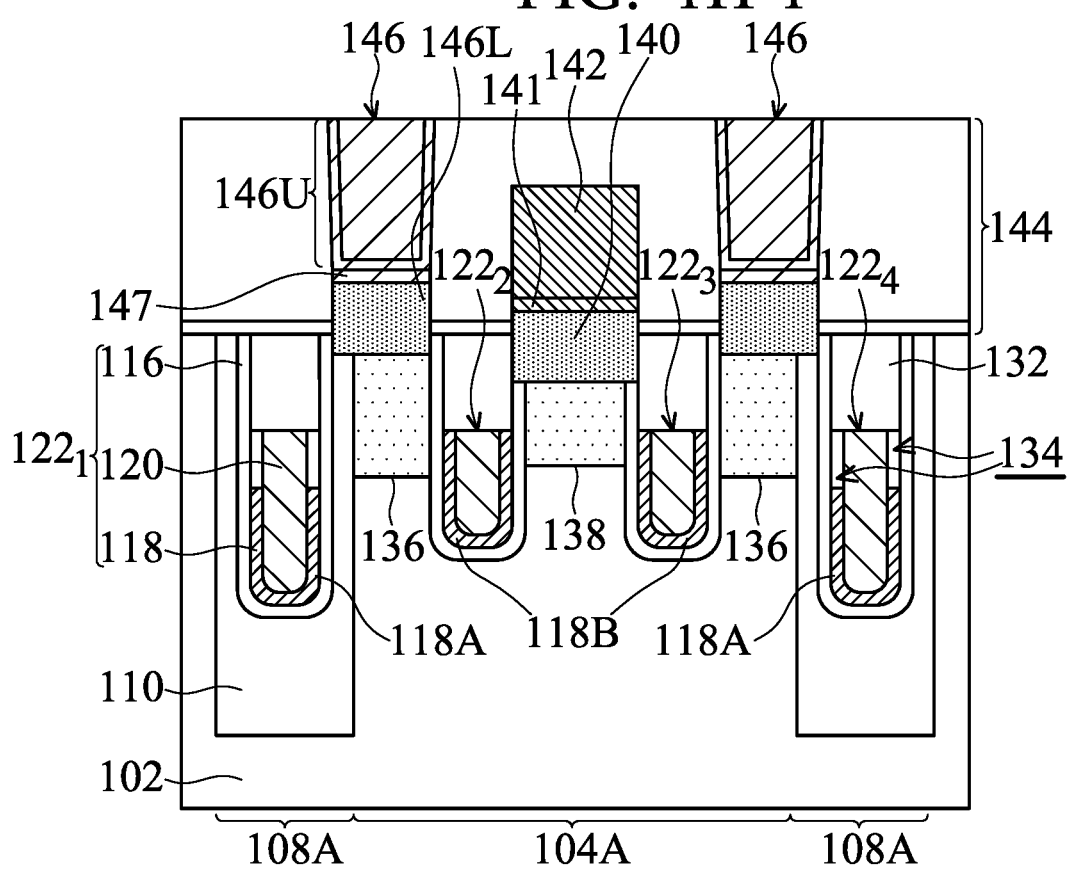
Figures 1, 1H, 2, 3:
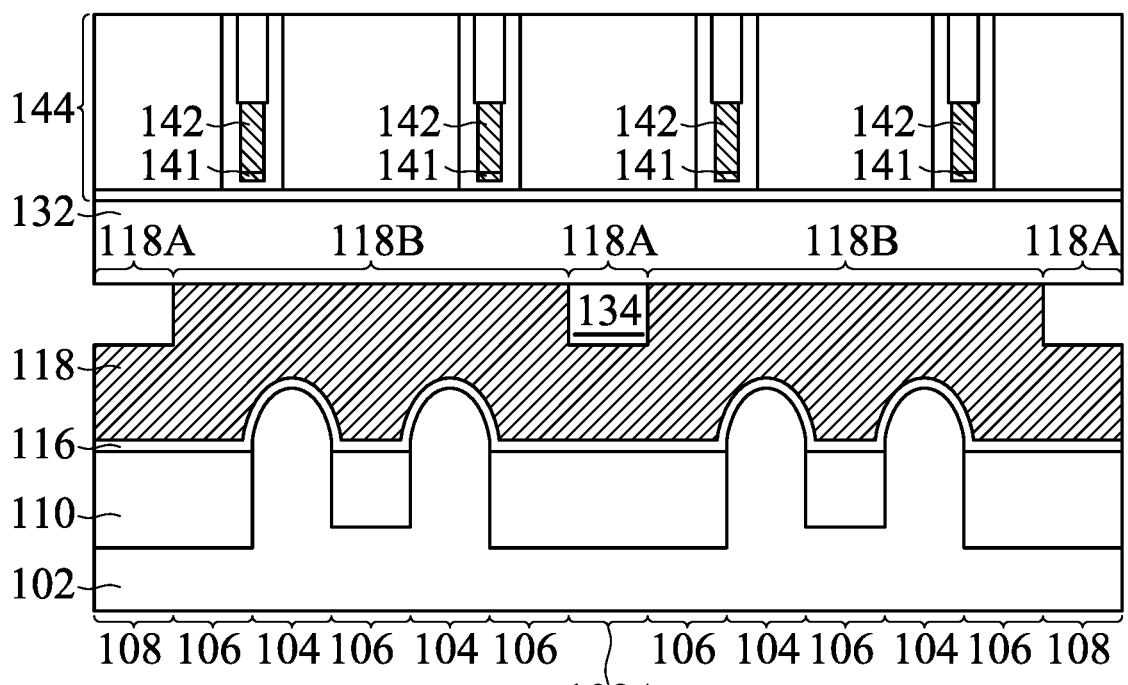
Figure 2:
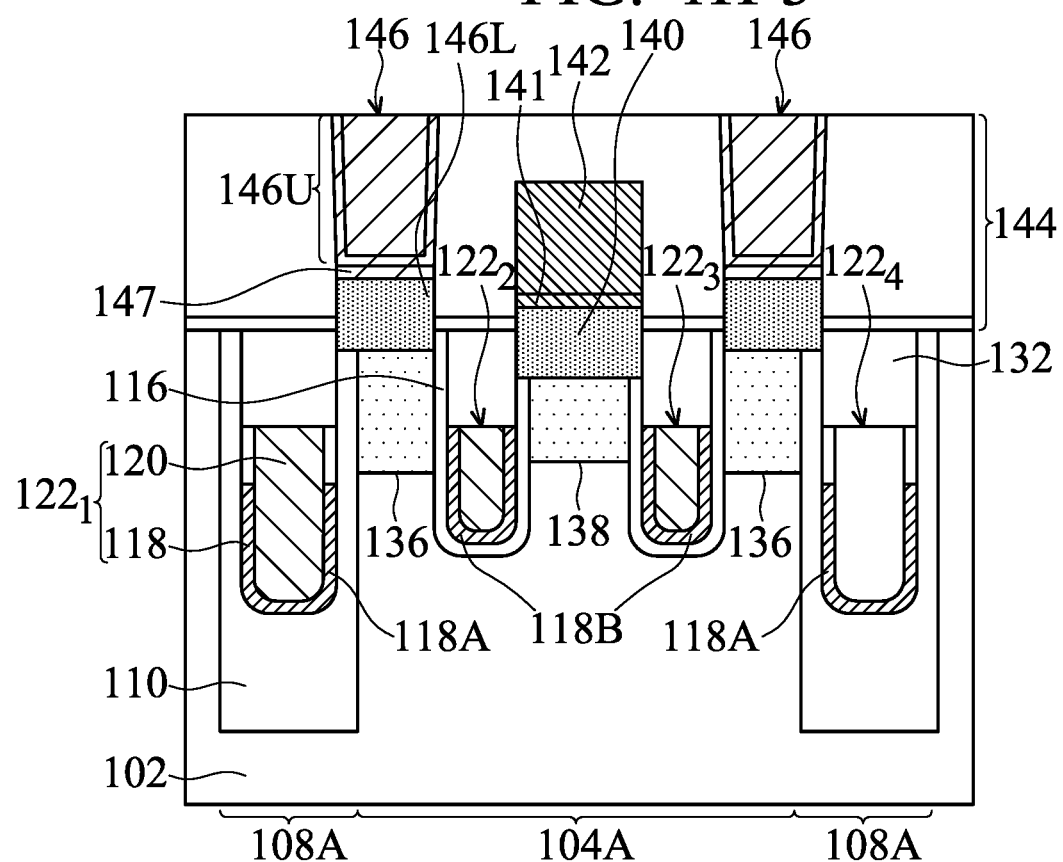

The source/drain region 136 and 138 are formed in the active region 104 of the semiconductor substrate 102 by an implant process, as shown in FIG. 1H-2. The source/drain region 138 is at the center of the active region 104, while the source/drain region 136 is at the opposite sides of the active region 104. The source/drain regions 136 and 138 may be doped, and the PN junction is formed between the active region 104 and the source/drain region 136 or 138. The source/drain regions 136 and 138 and the portions of the gate structures extending across the active region (e.g., gate structures $122_2$ and $122_3$ in the active region 104A) may be combined to form transistors for the resulting semiconductor memory device.

In some embodiments, the level of the upper surface of the depressions 118A of the gate lining layer 118 in the chop region 108 is lower than the level of the bottom surface of the source/drain region 136 (i.e., the PN junction as described above), and the level of the upper surface of the protrusions 118B of the gate lining layer 118 in the active region 104 and the isolation region 106 is higher than the level of the bottom surface of the source/drain region 136 (i.e., the PN junction as described above). The level of the upper surface of the protrusions 118B of the gate lining layer 118 in the active region 104 and the isolation region 106 is higher than the level of the bottom surface of the source/drain region 136 (i.e., the PN junction as described above).

A dielectric structure 144 may be formed on the semiconductor memory structure and a conductive feature may be formed in the dielectric structure 144 to electrically couple the source/drain regions 136 and 138. For example, as shown in FIGS. 1H, 1H-1, 1H-2, and 1H-3, a contact plug 140 is formed on the source/drain region 138; a bit line 142 is formed on the contact plug 140; and a contact plug 146 is formed on the source/drain region 136. Additional features may be formed on the semiconductor memory structure, such as capacitor structures, interconnect structures, or other suitable features, to create a semiconductor memory device. For example, the capacitor structure is formed and electrically connected to the contact plug 146. In some embodiments, the semiconductor memory device is a dynamic random access memory (DRAM) device.

In some embodiments, the dielectric structure 144 includes multiple dielectric layers formed of dielectric materials such as silicon oxide, silicon nitride, silicon oxynitride, multiple layers thereof, and/or a combination thereof.

In some embodiments, the contact plug 140 partially extends to the semiconductor substrate 102 and lands on the source/drain region 138. The contact plug 140 may be formed of semiconductor materials, such as polysilicon.

The bit line 142 extends along the third direction D3 and is electrically coupled to the source/drain region 138 via the contact plug 140. The bit line 142 may be formed of metals or metal nitrides, such as tungsten (W), aluminum (Al), copper (Cu), titanium (Ti), tantalum (Ta), titanium nitride (TiN), tantalum nitride (TaN), multiple layers thereof, or a combination thereof. The barrier layer 141 may be formed between the bit line 142 and the contact plug 140.

The contact plug 146 partially extends to the semiconductor substrate 102 and lands on the source/drain region 136. A capacitor structure (not shown) is formed on the dielectric structure 144 and may be electrically coupled to the source/drain region 136 via the contact plug 146. The contact plug 146 may include lower portions 146L and upper portions 146U. For example, the lower portions 146L of the contact plug 146 are formed of semiconductor materials, such as polysilicon. The upper portions 146U of the contact plugs 146 are formed of metals or metal nitrides, such as tungsten (W), aluminum (Al), copper (Cu), titanium (Ti), tantalum (Ta), titanium nitride (TiN), and/or tantalum nitride (TaN). The silicide layer 147 may be formed between the lower portions 146L and upper portions 146U of the contact plug 146.

In some cases, during the operation, the portions of the gate structure in the isolation structure of the chop region (which may be referred to as the passing word line, passing WL) may induce a channel layer in the active region adjacent to the gate structure (or on the sidewalls of the isolation structure). The channel layer is unnecessary and may provide various leakage paths, such as from the junction of the source/drain region to the semiconductor substrate, and to other contact plugs on the source/drain region, as well as possibly to other conductive features. This may result in the loss or degradation of data stored in the semiconductor memory device.

According to the present disclosure, the gate lining layer 118 in the chop region (e.g., chop region 108A) is recessed so that the level of the upper surface of the depressions 118A of the gate lining layer 118 is lower than the level of the bottom surface (i.e., the junction) of the source/drain region 136, which increases the distance between the source/drain region 136 and the adjacent passing WL (e.g., gate structures $122_1$ and/or $122_4$ in the chop region 108A) of the conductive material. The increased distance reduces the capacitance between the source/drain region and the passing WL, thereby reducing the possibility of forming the unnecessary channels described above. The increased distance further reduces the gate induced drain leakage (GIDL). Furthermore, the air gap 134 formed in the chop region 108 has a low k value (e.g., about 1), which may reduce the capacitance between the source/drain region and the passing WL. In addition, the gate lining layer 118 in the active region (e.g., active region 104A) remains un-recessed such that the level of the upper surface of the protrusions 118B of the gate lining layer 118 is higher than the level of the bottom surface of the source/drain region 136. As such, the channel length of the transistors of the semiconductor memory device may be maintained, which also maintains the on current (Ion) of the semiconductor memory device.

FIG. 2 illustrates a cross-sectional view of a semiconductor memory structure according to some embodiments of the present disclosure. The semiconductor memory structure shown in FIG. 2 is similar to the semiconductor memory structure shown in FIG. 1H-2, except that there is no gate dielectric layer formed between the gate lining layer and the isolation structure, and the gate lining layer 118 is connected to the interface of the isolation structure 110.

FIGS. 3A-1, 3B-1, and 3C-1 correspond to the cross-section B-B of FIGS. 1D, 1E, 1F, 1G, and 1H. FIGS. 3A-2, 3B-2, and 3C-2 correspond to the cross-section C-C of FIGS. 1D, 1E, 1F, 1G, and 1H.

Figures 1, 3A:
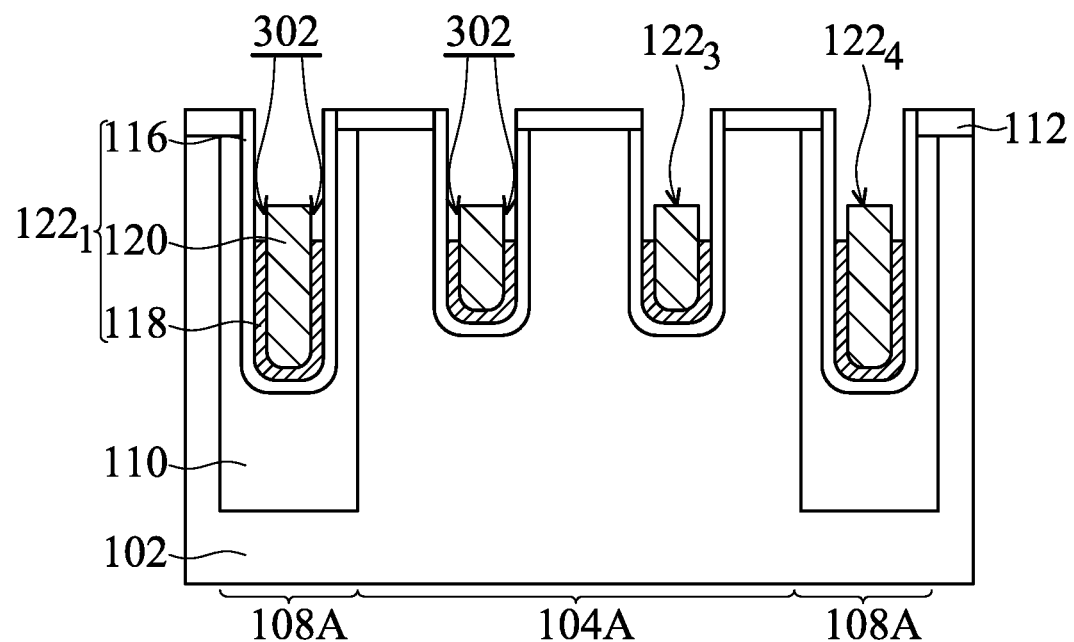
Figures 2, 3A:
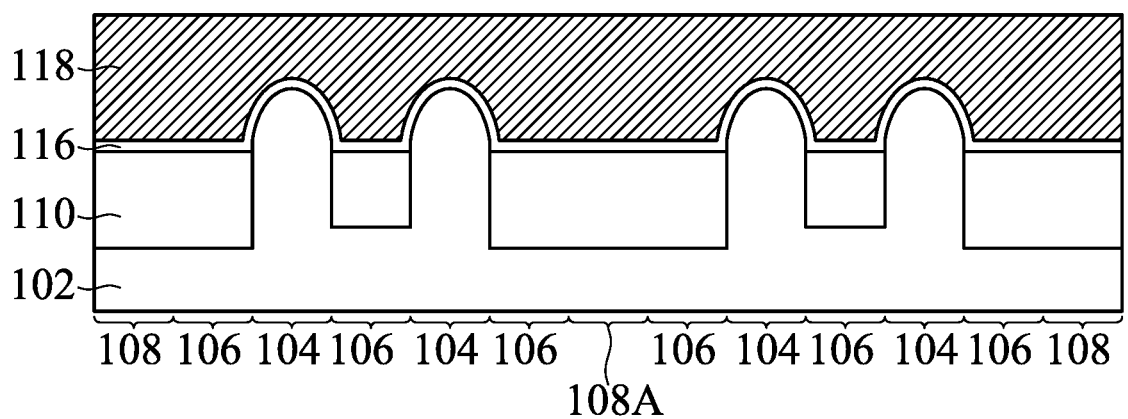

After performing the steps described in FIGS. 1A-1 to 1D-3, the gate structure 122 is fully etched to recess the gate lining layer 118. After the etching process, the gate electrode layer 120 protrudes above the gate lining layer 118, thereby forming a gap 302 between the gate electrode layer 120 and the gate dielectric layer 116, as shown in FIGS. 3A-1 and 3A-2.

Figures 1, 3B:
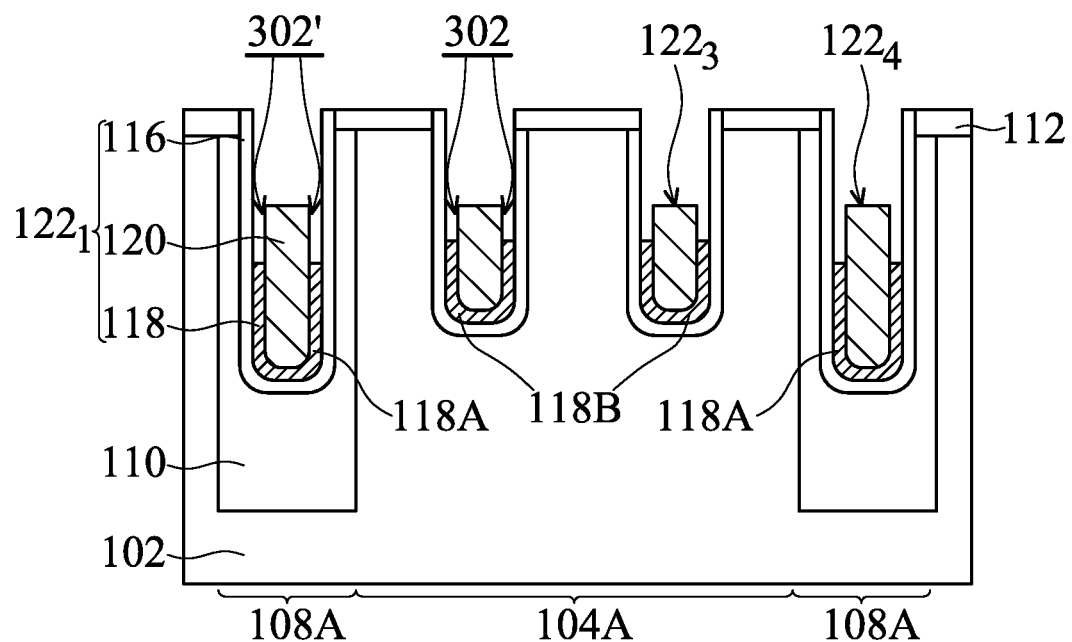
Figures 2, 3B:
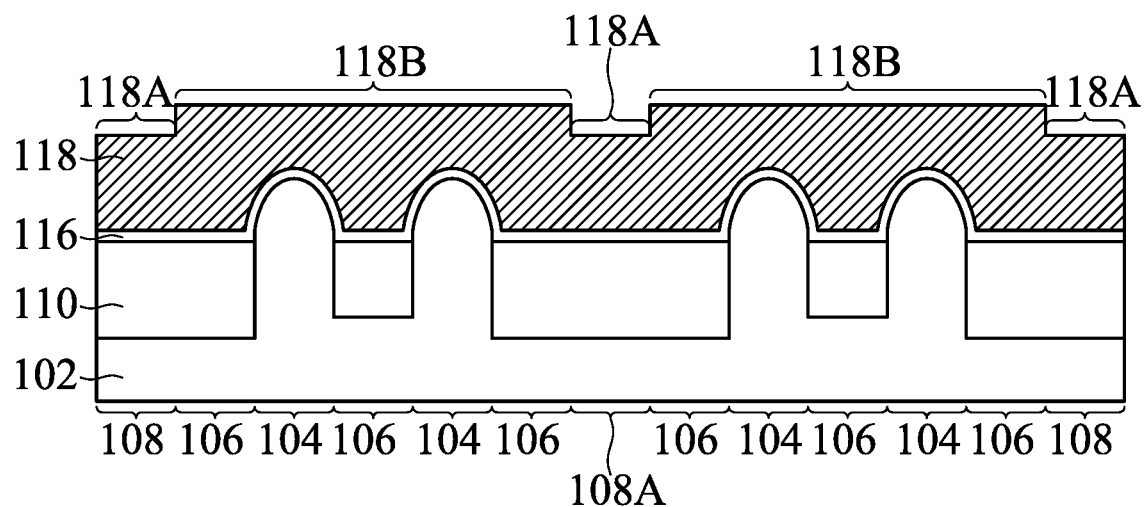

Next, the steps as described in FIGS. 1E-1 to 1F-3 for the semiconductor memory structure are performed. By using the patterned mask layer 126 (not shown), the gate lining layer 118 in the chop region 108 is recessed, thereby extending downward to the gap 302 in the chop region 108, as shown in FIGS. 3B-1 and 3B-2. The enlarged gap 302 is indicated as gap 302'. The gap 302 in the active region 104 and the isolation region 106 is covered by the patterned mask layer 126 (not shown) and thus not extended downward.

The more recessed portions of the gate lining layer 118 are referred to as depressions 118A, and the less recessed portions of the gate lining layer 118 are referred to as protrusions 118B. The depressions 118A correspond to and are located in the chop region 108, and the protrusions 118B correspond to and are located in the active region 104 and the isolation region 106. The depressions 118A and the protrusions 118B are alternately arranged in the second direction D2.

Figures 1, 3C:
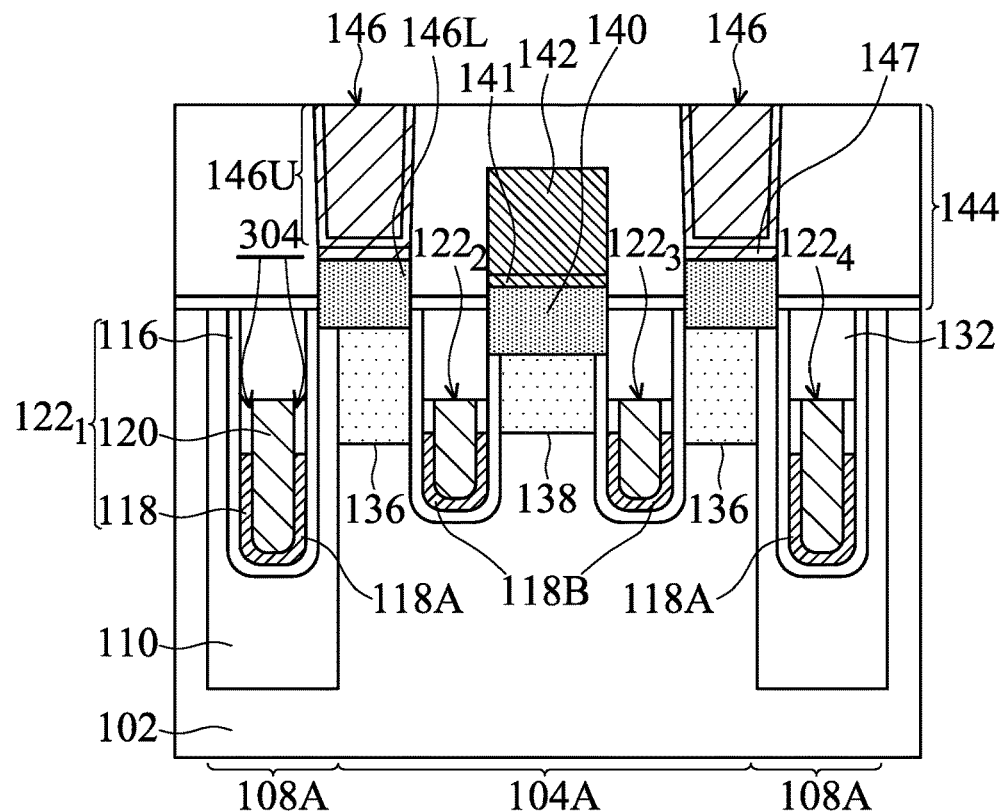
Figures 2, 3C:
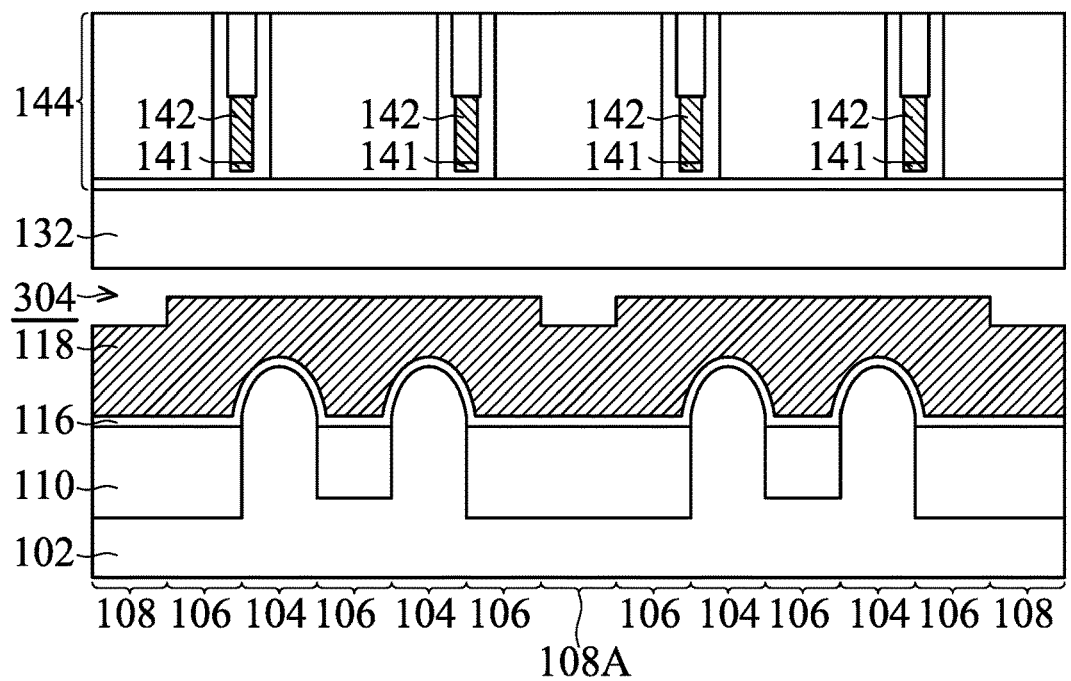

The semiconductor memory structure is then subjected to the steps described in FIGS. 1G-1 to 1H-3 to form a capping layer 132, source/drain regions 136 and 138, a dielectric structure 144, contact plugs 140 and 146, and bit lines 142, as shown in FIGS. 3C-1 and 3C-2. In some embodiments, the capping layer 132 seals the gaps 302 and 302' to form an air gap 304 between the gate electrode layer 120 and the gate dielectric layer 116. The air gap 304 extends continuously across the active region 104, the isolation region 106, and the chop region 108, as shown in FIG. 3C-2.

The source/drain regions 136 and 138 are formed in the active region 104 of the semiconductor substrate 102. In some embodiments, the level of the upper surface of the depressions 118A of the gate lining layer 118 (in the chop region 108) is lower than the level of the bottom surface of the source/drain region 136. The level of the upper surface of the protrusions 118B of the gate lining layer 118 (in the active region 104 and the isolation region 106) is higher than the level of the bottom surface of the source/drain region 136.

The recessed protrusions 118B may reduce the electric field intensity generated by the gate structure (e.g., $122_2$ or $122_3$) in the active region 104 to reduce the gate induced draw leakage (GIDL). Furthermore, the upper surface of the protrusions 118B remains higher than the bottom surface of the source/drain region 136, which maintains the on current (Ion) of the semiconductor memory device.

The present disclosure provides a gate lining layer including alternating concave and convex cross-section, wherein the depressions correspond to the chop region and the protrusions correspond to the active region. As a result, the on current (Ion) of the transistors of the semiconductor memory device is maintained while the capacitance of the source/drain region and the passing WL is reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory structure, comprising:
   a semiconductor substrate comprising a first active region and a chop region;
   a source/drain region disposed in the first active region;
   an isolation structure disposed in the chop region;
   a first gate structure extending at least across the isolation structure in the chop region, wherein the first gate structure comprises a first gate electrode layer and a first gate lining layer lining on the first gate electrode layer, and an upper surface of the first gate lining layer is lower than a bottom surface of the source/drain region;
   a capping layer disposed on the first gate structure; and
   an air gap between the capping layer and the first gate lining layer.

2. The semiconductor memory structure as claimed in claim 1, wherein the first gate lining layer is connected to an interface of the isolation structure in the chop region.

3. The semiconductor memory structure as claimed in claim 1, further comprising:
   a second gate structure extending across the first active region, wherein the second gate structure comprises a second gate electrode layer and a second gate lining layer lining on the second gate electrode layer, an upper surface of the second gate lining layer is higher than the bottom surface of the source/drain region, and the source/drain region is disposed between the first gate structure and the second gate structure.

4. The semiconductor memory structure as claimed in claim 3, wherein the upper surface of the second lining layer is coplanar with an upper surface of the second gate electrode layer.

5. The semiconductor memory structure as claimed in claim 3, wherein the upper surface of the second lining layer is lower than the upper surface of the second gate electrode layer.

6. The semiconductor memory structure as claimed in claim 1, wherein the first gate structure further extends across a second active region of the semiconductor substrate, wherein the first gate lining layer further comprises a portion in the second active region, and an upper surface of the portion of the first gate lining layer in the second active region is higher than the upper surface of the first gate lining layer in the chop region.

7. The semiconductor memory structure as claimed in claim 6,
   wherein the air gap exposes a side surface of the portion of the first gate lining layer in the second active region.

8. The semiconductor memory structure as claimed in claim 7, wherein the air gap continuously extends over the portion of the first gate lining layer in the second active region and the first gate lining layer in the chop region.

9. A semiconductor memory structure, comprising:
a semiconductor substrate;
a first gate structure embedded in the semiconductor substrate, wherein the first gate structure comprises a first gate lining layer;
a second gate structure embedded in the semiconductor substrate, wherein the second gate structure comprises a second gate lining layer; and
a source/drain region disposed in the semiconductor substrate, wherein a bottom surface of the source/drain region is higher than an upper surface of the first gate lining layer and is lower than an upper surface of the second gate lining layer.

10. The semiconductor memory structure as claimed in claim 9, wherein each of the first gate lining layer and the second gate lining layer comprises TiN, WN, or TaN.

11. The semiconductor memory structure as claimed in claim 9,
an isolation structure disposed in the semiconductor substrate, wherein the first gate lining layer is disposed in the isolation structure, the isolation structure separates the source/drain region from the first gate lining layer, and the semiconductor substrate comprises an active region, and the source/drain region and the second gate lining layer are disposed in the active region.

12. The semiconductor memory structure as claimed in claim 9, further comprising:
a dielectric structure, disposed on the semiconductor substrate;
a contact plug, disposed in the dielectric structure and on the source/drain region, wherein the contact plug is electrically connected to a capacitor.

13. The semiconductor memory structure as claimed in claim 9, wherein each of the first gate structure and the second gate structure further comprises a gate dielectric layer and a gate electrode layer, wherein each of the first gate lining layer and the second gate lining layer is disposed between the gate dielectric layer and the gate electrode layer.

14. The semiconductor memory structure as claimed in claim 13, wherein the gate electrode layer comprises W, Al, Cu, Co, or Ru.

15. A method for forming a semiconductor memory structure, comprising:
providing a semiconductor substrate, the semiconductor substrate comprising a chop region and an active region;
forming a first gate structure extending across the chop region and forming a second gate structure extending across the active region, wherein each of the first gate structure and the second gate structure comprises a gate electrode layer and a gate lining layer lining on the gate electrode layer;
forming a patterned mask layer covering the second gate structure and exposing the first gate structure;
using the patterned mask layer, etching the gate lining layer of the first gate structure; and
forming a source/drain region in the active region, wherein after etching the gate lining layer of the first gate structure, an upper surface of the gate lining layer of the first gate structure is lower than a bottom surface of the source/drain region.

16. The method as claimed in claim 15, wherein after etching the gate lining layer of the first gate structure, an upper surface of the gate lining layer of the second gate structure is higher than the bottom surface of the source/drain region.

17. The method as claimed in claim 15, wherein etching the gate lining layer of the first gate structure forms an air gap, wherein the method further comprises forming a capping layer on the first gate structure to seal the air gap.

18. The method as claimed in claim 15, further comprising:
before etching the gate lining layer of the first gate structure, recessing the gate lining layer of both the first gate structure and the second gate structure such that the gate electrode layer protrudes above the gate lining layer.

19. The method as claimed in claim 15, further comprising:
forming an isolation structure in the chop region, wherein the first gate structure extends across the isolation structure in the chop region.

20. The method as claimed in claim 19, wherein the source/drain region is formed between the isolation structure and the second gate structure.

* * * * *